(12) United States Patent
Hur et al.

(10) Patent No.: US 11,257,857 B2
(45) Date of Patent: Feb. 22, 2022

(54) IMAGE SENSORS INCLUDING PHOTOELECTRIC CONVERSION DEVICES, TRENCH, SUPPORTER, AND ISOLATION LAYER

(71) Applicant: Samsung Electronics Co., Ltd., Suwon-si (KR)

(72) Inventors: Jae Sung Hur, Yongin-si (KR); Jin Gyun Kim, Hwaseong-si (KR); Kook Tae Kim, Hwaseong-si (KR); Young Bin Lee, Suwon-si (KR); Ha Jin Lim, Seoul (KR); Taek Soo Jeon, Hwaseong-si (KR); Soo Jin Hong, Guri-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 162 days.

(21) Appl. No.: 16/655,762

(22) Filed: Oct. 17, 2019

(65) Prior Publication Data

US 2020/0219911 A1    Jul. 9, 2020

(30) Foreign Application Priority Data

Jan. 9, 2019    (KR) .......................... 10-2019-0002612

(51) Int. Cl.
*H04N 5/335* (2011.01)
*H01L 27/146* (2006.01)

(52) U.S. Cl.
CPC .... *H01L 27/1463* (2013.01); *H01L 27/14645* (2013.01)

(58) Field of Classification Search
CPC .................................................. H01L 27/14645
See application file for complete search history.

(56) References Cited

U.S. PATENT DOCUMENTS

| | | | |
|---|---|---|---|
| 7,498,246 B2 | 3/2009 | Kim | |
| 7,767,565 B2 | 8/2010 | Chung | |
| 8,119,439 B2 | 2/2012 | Park | |
| 8,664,578 B2 * | 3/2014 | Hirigoyen | H01L 27/14609 250/208.1 |
| 8,766,343 B2 | 7/2014 | Kang et al. | |
| 9,698,013 B2 | 7/2017 | Mukherjee et al. | |
| 9,728,570 B2 | 8/2017 | Chiang et al. | |
| 2005/0176167 A1 * | 8/2005 | Lee | H01L 27/1463 438/60 |

(Continued)

FOREIGN PATENT DOCUMENTS

WO    WO-2017010311 A1    1/2017

*Primary Examiner* — Gary C Vieaux
(74) *Attorney, Agent, or Firm* — Harness, Dickey & Pierce, P.L.C.

(57) ABSTRACT

An image sensor may include a substrate including first and second surfaces opposite each other, a plurality of photoelectric conversion devices isolated from direct contact with each other within the substrate, a first trench configured to extend into an interior of the substrate from the first surface of the substrate and between adjacent photoelectric conversion devices of the plurality of photoelectric conversion devices, a first supporter within the first trench, and a first isolation layer at least partially covering both sidewalls of the first supporter within the first trench, wherein a lower surface of the first supporter is coplanar with the first surface of the substrate.

19 Claims, 27 Drawing Sheets

(56) References Cited

U.S. PATENT DOCUMENTS

| | | | |
|---|---|---|---|
| 2007/0145516 A1* | 6/2007 | Lee .................. | H01L 27/14689 |
| | | | 257/499 |
| 2010/0237451 A1* | 9/2010 | Murakoshi .......... | H01L 27/1463 |
| | | | 257/432 |
| 2012/0261732 A1* | 10/2012 | Marty ............... | H01L 27/14689 |
| | | | 257/292 |
| 2017/0170229 A1* | 6/2017 | Oh .................... | H01L 27/14621 |
| 2019/0043902 A1* | 2/2019 | Lee .................. | H01L 27/14636 |

* cited by examiner

IMAGE SENSORS INCLUDING PHOTOELECTRIC CONVERSION DEVICES, TRENCH, SUPPORTER, AND ISOLATION LAYER

CROSS-REFERENCE TO RELATED APPLICATION

This application claims priority to Korean Patent Application No. 10-2019-0002612, filed on Jan. 9, 2019, and all the benefits accruing therefrom under 35 U.S.C. § 119, the disclosure of which is incorporated herein by reference in its entirety.

BACKGROUND

1. Technical Field

The present disclosure relates to image sensors.

2. Description of the Related Art

Image sensors are devices configured to convert an optical image into an electrical signal. Image sensors may be categorized into charge coupled device (CCD) type image sensors, and complementary metal oxide semiconductor (CMOS) type image sensors. CMOS type image sensors are briefly called 'CIS' (CMOS image sensor). A CIS may include a plurality of 2-dimensionally arranged pixels. Each of the pixels may include a photodiode (PD). A photodiode may function to convert at least a portion of incident light into an electrical signal.

In recent years, according to development in the computer and the communication industries, demand has increased for image sensors with enhanced performances in a variety of fields such as digital cameras, camcorders, personal communication systems (PCS), gaming devices, security cameras, medical micro cameras, robots, and so on. Further, the highly-integrated semiconductor device has enabled high integration of image sensors.

SUMMARY

Some example embodiments of the present disclosure provide image sensors configured to mitigate or prevent leaning or bending phenomenon of each of structures which are separated with an isolation region on a fabrication process of an image sensor by disposing a supporter within the isolation region (e.g., deep trench isolation, DTI) which is formed between each of a plurality of photoelectric conversion devices, thereby improving performance of the image sensors.

According to some example embodiments of the present disclosure, an image sensor may include a substrate including first and second surfaces opposite each other, a plurality of photoelectric conversion devices isolated from direct contact with each other within the substrate, a first trench configured to extend into an interior of the substrate from the first surface of the substrate and between adjacent photoelectric conversion devices of the plurality of photoelectric conversion devices, a first supporter within the first trench, and a first isolation layer at least partially covering both sidewalls of the first supporter within the first trench. A lower surface of the first supporter may be coplanar with the first surface of the substrate.

According to some example embodiments of the present disclosure, an image sensor may include a substrate including first and second surfaces opposite each other, a plurality of photoelectric conversion devices within the substrate, a supporter, and a first isolation layer at least partially covering both sidewalls of the supporter within the substrate. A lower surface of the supporter may be coplanar with the first surface of the substrate. The plurality of photoelectric conversion devices may include a first photoelectric conversion device, a second photoelectric conversion device isolated from direct contact with the first photoelectric conversion device in a first direction, a third photoelectric conversion device isolated from direct contact with the first photoelectric conversion device in a second direction orthogonal to the first direction, and a fourth photoelectric conversion device isolated from direct contact with the third photoelectric conversion device in the first direction. The supporter may include a first portion between the first photoelectric conversion device and the second photoelectric conversion device and a second portion between the third photoelectric conversion device and the fourth photoelectric conversion device.

According to some example embodiments of the present disclosure, an image sensor may include a substrate including first and second surfaces opposite each other, a plurality of photoelectric conversion devices isolated from direct contact with each other within the substrate, a first isolation layer between adjacent photoelectric conversion devices of the plurality of photoelectric conversion devices and exposed from the first surface of the substrate, a second isolation layer on the first isolation layer within the substrate; and a supporter within the first isolation layer and having a lower surface coplanar with the first surface of the substrate.

According to some example embodiments of the present disclosure, a method for fabricating an image sensor may include forming a first trench on a first surface of a substrate, forming a first filling layer within the first trench, forming a second trench that penetrates through the first filling layer in an orthogonal direction to a first surface of the substrate, forming a sacrificial layer that entirely fills the second trench, etching at least a portion of the sacrificial layer such that at least a portion of the second trench is not filled by the sacrificial layer, forming a supporter layer on the sacrificial layer so as to fill the portion of the second trench that is not filled by the sacrificial layer, removing the sacrificial layer from an inner portion of the second trench, forming a second isolation layer within the inner portion of the second trench, etching the first filling layer to form a first isolation layer within the first trench, such that the first isolation layer is exposed from a same plane as the first surface of the substrate, and forming photoelectric conversion devices within the substrate on opposite sides of the first and second isolation layers.

The objectives that are intended to be addressed by the present disclosure are not limited to those mentioned above, and other objectives that are not mentioned above may be clearly understood to those skilled in the art based on the description provided below.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which.

DETAILED DESCRIPTION

Hereinbelow, an image sensor according to some example embodiments will be described with reference to FIG. 1.

Figure 1:
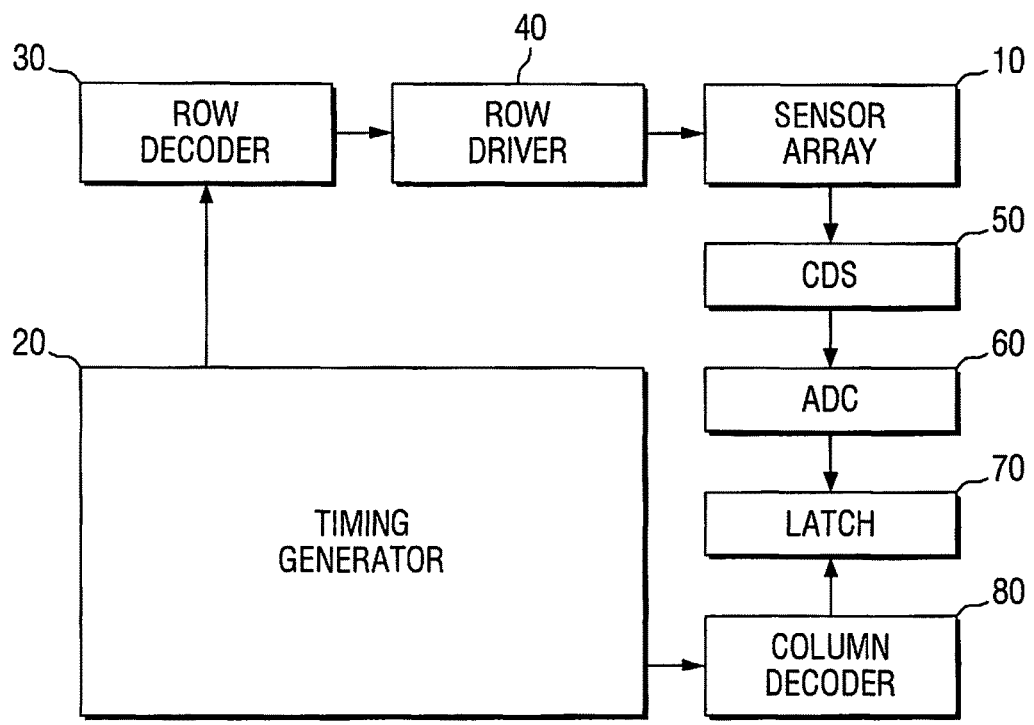
FIG. 1 is a block view of an image sensor according to some example embodiments.

FIG. 1 is a block view of an image sensor according to some example embodiments.

Referring to FIG. 1, the image sensor according to some example embodiments includes an active pixel sensor array 10, a timing generator 20, a row decoder 30, a row driver 40, a correlated double sampler (CDS) 50, an analog to digital converter (ADC) 60, a latch 70, a column decoder 80, and so on. It will be understood that at least some functionality of the image sensor may be implemented by an instance of processing circuitry (e.g., a central processing unit (CPU)) executing a program of instructions stored on a memory (e.g., a Solid State Drive (SSD) storage device), where the image sensor of FIG. 1 includes the instance of processing circuitry and the memory.

The active pixel sensor array 10 includes one or more photoelectric conversion devices and a plurality of 2-dimensionally arranged unit pixels. A plurality of unit pixels may perform a function of converting an optical image into an electrical output signal.

The active pixel sensor array 10 may receive a plurality of driving signals including row-select signal, reset signal, charge transfer signal, and so on from the row driver 40 and may be driven accordingly. Further, the converted electrical output signal may be provided (e.g., generated, transmitted, directed, or the like) to the correlated double sampler 50 through vertical signal lines.

The timing generator 20 may provide (e.g., generate, direct, transmit, or the like) a timing signal and a control signal to the row decoder 30 and the column decoder 80.

The row driver 40 may provide a plurality of driving signals to the active pixel sensor array 10 for driving a plurality of unit pixels according to a result of decoding at the row decoder 30. Generally, the driving signals may be provided to each of the rows when the unit pixels are arranged in a matrix form.

The correlated double sampler 50 may receive an output signal formed at the active pixel sensor array 10 through a vertical signal line, and hold and sample the received signal. That is, the correlated double sampler 50 may double-sample a certain noise level and a signal level according to the output signal, and output a difference level corresponding to a difference between the noise level and the signal level.

The analog to digital converter 60 may convert an analog signal corresponding to the difference level into a digital signal, and output the result of conversion.

The latch 70 may latch the digital signal, and the latched signal may be outputted to an image signal processor sequentially according to the result of decoding at the column decoder 80.

Hereinafter, an equivalent circuit view of a sensor array according to some example embodiments will be described with reference to FIG. 2.

Figure 2:
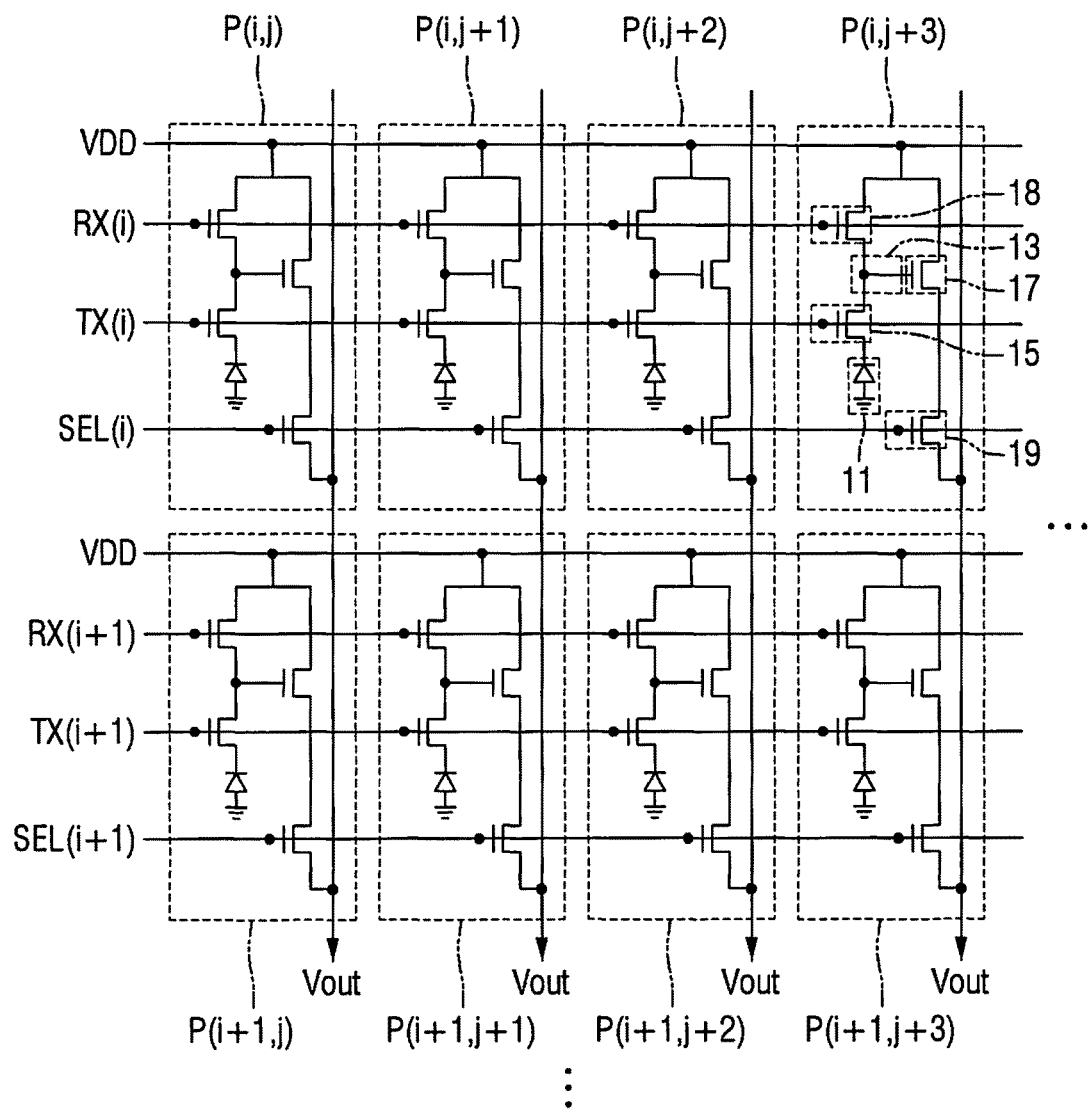
FIG. 2 is an equivalent circuit view of a sensor array of FIG. 1.

FIG. 2 is an equivalent circuit view of the sensor array of FIG. 1.

Referring to FIG. 2, the sensor array 10 may include a plurality of pixels P that may be arranged in a matrix form, having "i" rows and "j" columns where "i" and "j" may each be a separate positive integer, to construct the active pixel sensor array 10. Each of the pixels P includes a photoelectric conversion device 11, a floating diffusion region 13, a charge transfer device 15, a drive device 17, a reset device 18, and a select device 19. These functions will be described with reference to an i-th row pixel (P(i, j), P(i, j+1), P(i, j+2), P(i, j+3), . . . ) as an example.

The photoelectric conversion device 11 of each pixel P may absorb incident light and accumulate charges corresponding to a quantity of light. For the photoelectric conversion device 11, a photodiode, a phototransistor, a photogate, a pinned photodiode or a combination thereof may be applied, although the photodiode is illustrated in the drawings as an example.

The photoelectric conversion device 11 of each pixel P may be coupled with the charge transfer device 15 of the pixel P which transfers the accumulated charges to the floating diffusion region 13 of the pixel P.

The floating diffusion region 13 of each pixel P is a region where the charges are converted into voltages, and because of the parasitic capacitance, the charges may be accumulatively stored.

The drive device 17 of each pixel P, shown herein as a source follower amplifier, may amplify a change in the electrical potential in the floating diffusion region 13 of the pixel P transferred with the accumulated charges of the photoelectric conversion device 11 of the pixel P, and output the amplified result to an output line Vout.

The reset device 18 of each pixel P may periodically reset the floating diffusion region 13 of the pixel P. The reset device 18 of each i-th row pixel P may at least partially comprise one MOS transistor that is driven by the bias provided by a reset line RX(i) for applying a particular (or, alternatively, predetermined) bias (i.e., reset signal).

When the reset device 18 of an i-th row pixel P is turned on by the bias provided by the reset line RX(i), a particular (or, alternatively, predetermined) electrical potential provided to a drain of the reset device 18, e.g., a power voltage (VDD), may be transmitted to the floating diffusion region 13.

The select device 19 of each pixel P may perform a function of selecting the pixel P to read in a row unit. The select device 19 of each i-th row pixel P may at least partially comprise one MOS transistor that is driven by the bias (i.e., row select signal) provided by the row select line SEL(i).

When the select device 19 of an i-th row pixel P is turned on by the bias provided by the row select line SEL(i), a particular (or, alternatively, predetermined) electrical potential provided to a drain of the select device 19, e.g., a power voltage (VDD), may be transmitted to the drain region of the drive device 17 of the i-th row pixel P.

A transfer line TX(i) to apply the bias to the charge transfer device 15 of an i-th row pixel P, the reset line RX(i) to apply the bias to the reset device 18 of the i-th row pixel P, and the row select line SEL(i) of the i-th row pixel P to apply the bias to the select device 19 of the i-th row pixel P may be extended in parallel with each other in a row direction and arranged. It will be understood that elements that are "parallel" with each other, as used herein, includes elements that are parallel with each other within manufacturing tolerances and/or material tolerances.

Hereinbelow, an image sensor according to some example embodiments will be described with reference to FIG. 3 and FIG. 4.

Figure 3:
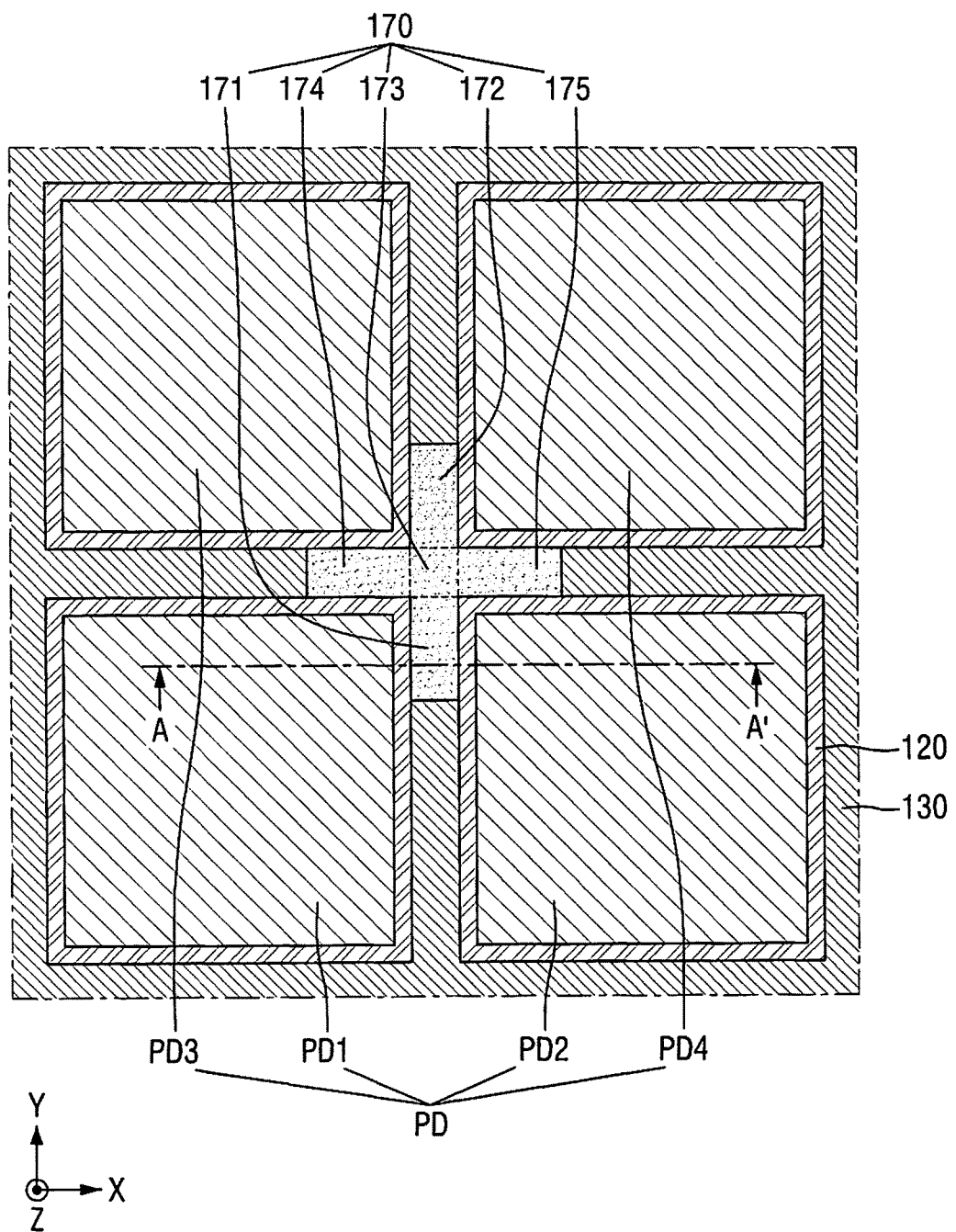
FIG. 3 is a view provided to explain an image sensor according to some example embodiments.

FIG. 3 is a view provided to explain an image sensor according to some example embodiments. FIG. 4 is a cross-sectional view taken on line A-A' of FIG. 3.

Figure 4:
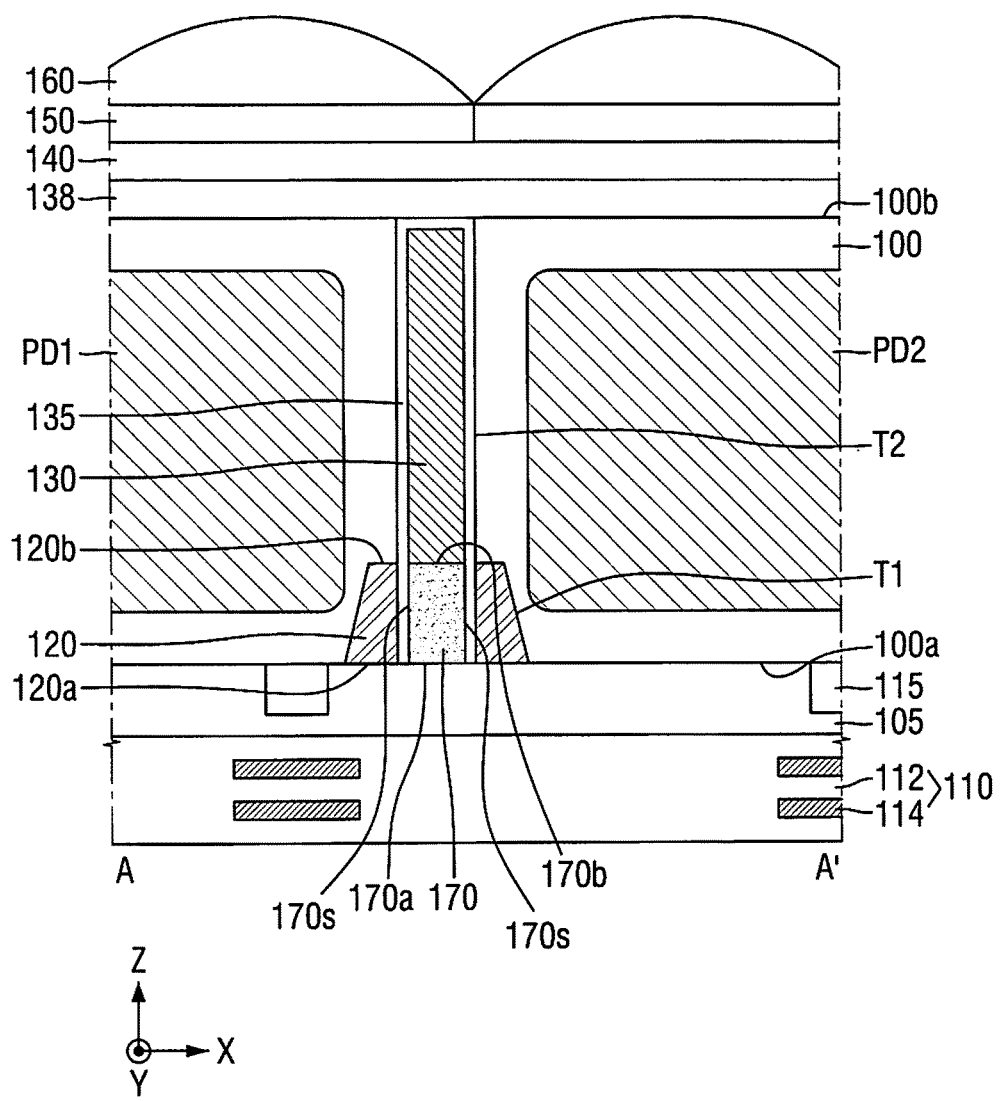
FIG. 4 is a cross-sectional view taken on line A-A' of FIG. 3.

Referring to FIG. 3 and FIG. 4, the image sensor according to some example embodiments includes a substrate 100, a one or more photoelectric conversion devices PD, an insulating layer 105, an insulating structure 110, a gate 115, a first isolation layer 120, a second isolation layer 130, a first trench passivation layer 135, a passivation layer 138, a planarization layer 140, a color filter 150, a microlens 160 and a first supporter 170.

The substrate 100 includes a first surface 100a and a second surface 100b opposite each other. A first surface 100a of the substrate may be a back side of the substrate 100, and a second surface 100b of the substrate may be a front side of the substrate 100.

For example, the substrate 100 may use a P-type or an N-type bulk substrate, or may use a P-type or an N-type epitaxial layer grown on the P-type bulk substrate, or may use a P-type or an N-type epitaxial layer grown on the N-type bulk substrate. Further, a substrate other than a semiconductor substrate, such as an organic plastic substrate and so on, may also be used for the substrate 100.

Each photoelectric conversion device PD may be disposed within the substrate 100. Each photoelectric conversion device PD may be a photodiode, for example, although the present disclosure is not limited thereto.

A plurality of photoelectric conversion devices PD may be disposed within the substrate 100. Referring to FIG. 3, a plurality of photoelectric conversion devices PD may include, for example, first to fourth photoelectric conversion devices PD1, PD2, PD3, PD4 which are spaced apart from one another (e.g., isolated from direct contact with each other) and disposed within the substrate 100, such that the substrate 100 isolates the first to fourth photoelectric conversion devices PD1, PD2, PD3, PD4 from exposure to an exterior of the image sensor.

Specifically, a plurality of photoelectric conversion devices PD may include a first photoelectric conversion device PD1, a second photoelectric conversion device PD2 spaced apart from (e.g., isolated from direct contact with) the first photoelectric conversion device PD1 in a first direction X, a third photoelectric conversion device PD3 spaced apart from (e.g., isolated from direct contact with) the first photoelectric conversion device PD1 in a second direction Y orthogonal to the first direction X, and a fourth photoelectric conversion device PD4 spaced apart from (e.g., isolated from direct contact with) the third photoelectric conversion device PD3 in the first direction X. However, a number of photoelectric conversion devices PD illustrated in FIG. 3 is only for convenience of explanation, and is not be limited.

A plurality of gates 115 may be spaced apart from one another and disposed on a first surface 100a of the substrate 100. Each of the plurality of gates 115 may be disposed to be spaced apart from one another in the first direction X and extend in the second direction Y. For example, a plurality of gates 115 may include gates of the charge transfer device, gates of the reset device, gates of the drive device, and so on.

Although FIG. 4 depicts that two gates are disposed on a first surface 100a of the substrate 100, this is only for convenience of explanation, and the present disclosure is not limited thereto.

It will be understood that an element that is "on" another element may be above or below the other element. In addition, an element that is "on" another element may be directly on the other element, such that the elements are in direct contact with each other, or indirectly on the other element, such that one or more interposing elements are located between the elements.

Although it is illustrated in FIG. 4 that each of the plurality of gates 115 is disposed on a first surface 100a of the substrate 100, the present disclosure is not limited thereto. That is, according to some example embodiments, each of the plurality of gates 115 may be recessed within the substrate 100 and buried within the substrate 100. In some example embodiments, one or more gates 115 may be on a second surface 100b of the substrate 100.

The insulating structure 110 may be disposed on a first surface 100a of the substrate 100. That is, the insulating structure 110 may be disposed on a back side of the substrate 100. The insulating structure 110 may include a metal wire 114 and an interlayer insulating layer 112 disposed to wrap the metal wire 114.

The interlayer insulating layer 112 may include, for example, silicon oxide ($SiO_2$), silicon nitride (SiN), silicon oxynitride (SiON), a low-k dielectric material, or any combination thereof.

For example, the metal wire 114 may include aluminum Al, copper Cu, tungsten W, cobalt Co, ruthenium Ru, and so on, but the present disclosure is not limited thereto.

The metal wire 114 may include a plurality of wires stacked sequentially. Although it is illustrated in FIG. 4 that the metal wire 114 includes two layers stacked sequentially, this is only for convenience of explanation, and thus the present disclosure is not limited thereto.

The insulating layer 105 may be disposed between a first surface 100a of the substrate 100 and the insulating structure 110. The insulating layer 105 may be disposed to overlie each of the plurality of gates 115 on a first surface 100a of the substrate 100.

The insulating layer 105 may include, for example, silicon oxide ($SiO_2$), silicon nitride (SiN), silicon oxynitride (SiON), a low-k dielectric material, or any combination thereof.

The passivation layer 138 may include a high-k insulating material, for example. Further, the passivation layer 138 may include an amorphous crystal structure. More specifically, at least a portion of the high-k insulating material included in the passivation layer 138 may have an amorphous crystal structure. However, the present disclosure is not limited thereto.

The color filter 150 may be disposed on the passivation layer 138. The color filter 150 may be disposed on a second surface 100b of the substrate 100, and disposed between the passivation layer 138 and the microlens 160 to be described below.

The color filter 150 may include, for example, a red color filter, a green color filter, and a blue color filter.

The microlens 160 may be disposed on the passivation layer 138. Specifically, the microlens 160 may be disposed on the passivation layer 138 and the color filter 150 which are stacked sequentially on a second surface 100b of the substrate 100. The microlens 160 may at least partially comprise an organic material such as photosensitive resin, or inorganic material.

The planarization layer 140 may be disposed between the passivation layer 138 and the color filter 150. For example, the planarization layer 140 may include silicon oxide film-based material, silicon nitride film-based material, resin, or any combination thereof.

Although it is illustrated in FIG. 4 that the planarization layer 140 is formed as a single film, this is only for convenience of explanation, and the present disclosure is not limited thereto.

As shown in FIGS. 3-4, a first trench T1 may be formed to extend in an inner portion of the substrate 100 from a first surface 100a of the substrate 100 between each of a plurality of photoelectric conversion devices PD. As shown, the depth of the first trench T1 may extend from the first surface 100a into an interior of the substrate 100 (e.g., within the substrate 100) in a direction that extends perpendicular to the first surface 100a (e.g., the third direction Z) between adjacent photoelectric conversion device PD of the plurality of photoelectric conversion devices PD1, PD2, PD3, PD4.

The first isolation layer 120 may be disposed within the first trench T1. A lower surface 120a of the first isolation layer 120 may be in contact with the insulating layer 105. As shown, the first isolation layer 120 may be exposed from the first surface 100a of the substrate 100.

Although it is illustrated in FIG. 4 in that a width in the first direction X of an upper surface 120b of the first isolation layer 120 is formed to be different from a width of a lower surface 120a of the first isolation layer 120, the present disclosure is not limited thereto.

For example, the first isolation layer 120 may include silicon oxide ($SiO_2$), silicon nitride (SiN), silicon carbide (SiC), silicon oxycarbide (SiOC), silicon oxynitride (SiON), silicon oxycarbon nitride (SiOCN), or any combination thereof.

As shown in FIGS. 3-4, the first supporter 170 may be disposed within the first trench T1, such that the first supporter 170 does not extend out of the first trench T1 and does not extend through a plane defined by the first surface 100a. As shown in FIG. 4, in some example embodiments, a lower surface 170a of the first supporter 170 may be coplanar with the first surface 100a. It will be understood that an element that is "coplanar" with another element, as used herein, may be coplanar with the other element within manufacturing tolerances and/or material tolerances. The first isolation layer 120 may be disposed along (e.g., may at least partially cover) both sidewalls 170s of the first supporter 170 within the first trench T1. That is, the first isolation layer 120 may be disposed between each photoelectric conversion device of the plurality of photoelectric conversion devices PD and the first supporter 170.

The first supporter 170 may be disposed to fill at least a portion of the first trench T1. That is, the first supporter 170 may be disposed on at least a portion between each of the plurality of photoelectric conversion devices PD.

The first supporter 170 may include first to fifth portions 171, 172, 173, 174, 175 disposed between each of the plurality of photoelectric conversion devices PD.

A first portion 171 of the first supporter 170 may extend in the second direction Y between the first photoelectric conversion device PD1 and the second photoelectric conversion device PD2. A second portion 172 of the first supporter 170 may extend in the second direction Y between the third photoelectric conversion device PD3 and the fourth photoelectric conversion device PD4. A fourth portion 174 of the first supporter 170 may extend in the first direction X between the first photoelectric conversion device PD1 and the third photoelectric conversion device PD3. A fifth portion 175 of the first supporter 170 may extend in the first direction X between the second photoelectric conversion device PD2 and the fourth photoelectric conversion device PD4. A third portion 173 of the first supporter 170 may be disposed between each of a first portion 171, a second portion 172, a fourth portion 174, and a fifth portion 175, and may connect a first portion 171, a second portion 172, a fourth portion 174 and a fifth portion 175 respectively.

A first portion 171 of the first supporter 170 may be disposed between the first photoelectric conversion device PD1 and the second photoelectric conversion device PD2 and only on a region of a portion adjacent to a third portion 173 of the first supporter 170. The second isolation layer 130 may be disposed on a remained region between the first photoelectric conversion device PD1 and the second photoelectric conversion device PD2. As shown, the second isolation layer 130 may be on the first isolation layer 120 within the substrate 100.

As described herein, it will be understood that an element that is "within" another element (e.g., within the substrate 100) will be understood to be located entirely within a volume that is defined by outer surfaces of the other element, excluding boundaries defined by surfaces of openings, conduits, trenches or the like extending from one or more of the outer surfaces. For example, the second isolation layer 130 will be understood to be within the substrate 100 at least by virtue of being located entirely within a volume at least partially defined by the first and second surfaces 100a and 100b of the substrate 100.

A second portion 172 of the first supporter 170 may be disposed only on a region of a portion adjacent to a third portion 173 of the first supporter 170 between the third photoelectric conversion device PD3 and the fourth photoelectric conversion device PD4. The second isolation layer 130 may be disposed on a remained region between the third photoelectric conversion device PD3 and the fourth photoelectric conversion device PD4.

A fourth portion 174 of the first supporter 170 may be disposed only on a region of a portion adjacent to a third portion 173 of the first supporter 170 between the first photoelectric conversion device PD1 and the third photoelectric conversion device PD3. The second isolation layer 130 may be disposed on a remained region between the first photoelectric conversion device PD1 and the third photoelectric conversion device PD3.

A fifth portion 175 of the first supporter 170 may be disposed only on a region of a portion adjacent to a third portion 173 of the first supporter 170 between the second photoelectric conversion device PD2 and the fourth photoelectric conversion device PD4. The second isolation layer 130 may be disposed on a remained region between the second photoelectric conversion device PD2 and the fourth photoelectric conversion device PD4.

A lower surface 170a of the first supporter 170 may be formed to be coplanar with a first surface 100a of the substrate 100. A lower surface 170a of the first supporter 170 may be formed to be coplanar with a lower surface 120a of the first isolation layer 120. Further, an upper surface 170b of the first supporter 170 may be formed to be coplanar with an upper surface 120b of the first isolation layer 120.

For example, the first supporter 170 may include silicon oxide (SiO$_2$), silicon nitride (SiN), silicon carbide (SiC), silicon oxycarbide (SiOC), silicon oxynitride (SiON), silicon oxycarbon nitride (SiOCN), or any combination thereof. Further, the first supporter 170 may include metal oxide, for example. However, the present disclosure is not limited thereto.

As shown in FIGS. 3-4, a second trench T2 may be formed on the first trench T1 (e.g., on a surface of the first trench T1 that is distal from the first surface 100a) between each of the plurality of photoelectric conversion devices PD. The second trench T2 may be formed to extend within the substrate 100 from a first surface 100a of the substrate 100. As shown, the depth of the second trench T2 may extend from the first surface 100a into an interior of the substrate 100 (e.g., within the substrate 100) in a direction that extends perpendicular to the first surface 100a (e.g., the third direction Z) between adjacent photoelectric conversion device PD of the plurality of photoelectric conversion devices PD1, PD2, PD3, PD4. The second trench T2 may extend to (e.g., towards or entirely to) a second surface 100b of the substrate 100 in a third direction Z orthogonal to the first and second directions X, Y. As shown in FIG. 4, for example, the second trench T2 extends entirely to the second surface 100b so as to establish an opening in the second surface 100b. However, the present disclosure is not limited thereto.

A width of the second trench T2 in the first direction X may be formed to be narrower than a width of the first trench T1 in the first direction X. The first supporter 170 may be disposed within the second trench T2 overlapping the first trench T1 in the first direction X.

The second isolation layer 130 may be disposed on the first supporter 170 in an inner portion of the second trench T2 such that the second isolation layer 130 does not extend out of the second trench T2 and thus does not extend through any of the planes defined by the surfaces 100b, 120b, and/or 170b. The second isolation layer 130 may overlap the first supporter 170 in the third direction Z.

The second isolation layer 130 may include a material different from that of the first isolation layer 120. The second isolation layer 130 may include a material having excellent gap-fill performance, e.g., poly-silicon (poly-Si). However, the present disclosure is not limited thereto.

The first trench passivation layer 135 may be disposed along a sidewall and an upper portion of the second trench T2 within the second trench T2. Specifically, the first trench passivation layer 135 may be disposed between a sidewall of the second isolation layer 130 and the substrate 100 within the second trench T2 and between the second isolation layer 130 and the passivation layer 138. The first trench passivation layer 135 may wrap an upper surface and a sidewall of the second isolation layer 130. Further, the first trench passivation layer 135 may wrap a sidewall of the first supporter 170.

Although it is illustrated in FIG. 4 that the first trench passivation layer 135 is formed conformally within the second trench T2, the present disclosure is not limited thereto.

The first trench passivation layer 135 may include a material same as that of the passivation layer 138, e.g., a high-k insulating material. However, the present disclosure is not limited thereto. That is, according to some example embodiments, the first trench passivation layer 135 may include a material different from that of the passivation layer 138.

The image sensor according to some example embodiments may mitigate or prevent leaning or bending phenomenon of each of structures which are separated by an isolation region on a fabrication process of the image sensor by disposing the first supporter 170 within an isolation region (e.g., deep trench isolation, DTI) formed between each of a plurality of photoelectric conversion devices PD. Accordingly, performance of the image sensor may be improved as a result of such mitigation or prevention.

Hereinbelow, a method for fabricating an image sensor according to some example embodiments will be explained with reference to FIG. 5 to FIG. 17.

FIGS. 5, 6, 7, 8, 9, 10, 11, 12, 13, 14, 15, 16, and FIG. 17 are views illustrating intermediate stages of fabrication, provided to explain a method for fabricating an image sensor according to some example embodiments.

Figure 5:
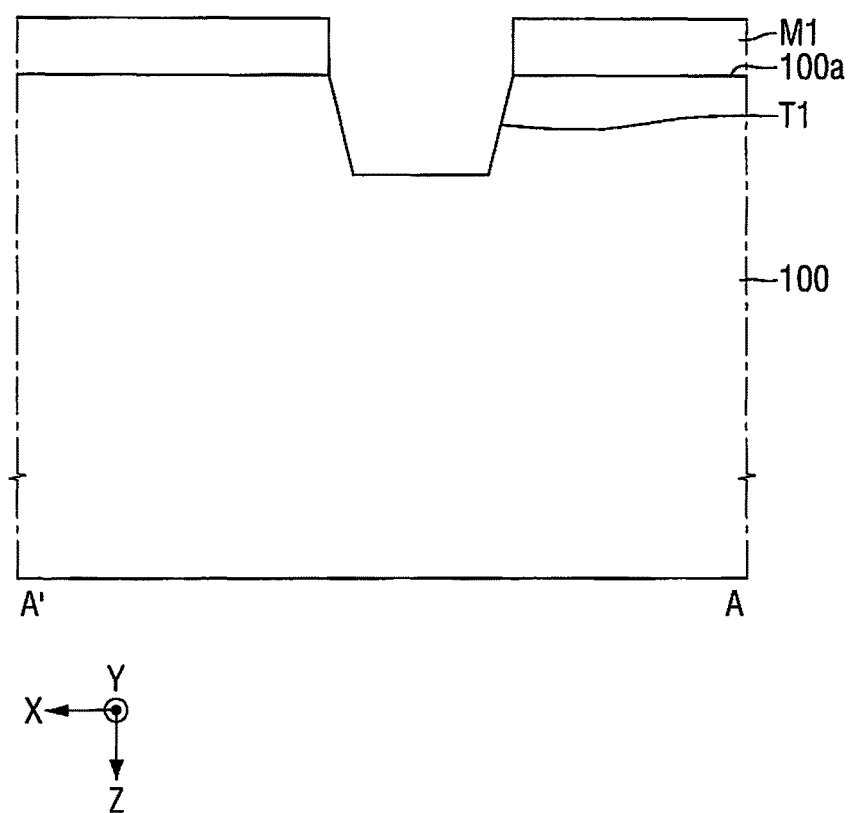
FIGS. 5, 6, 7, 8, 9, 10, 11, 12, 13, 14, 15, 16, and 17 are views illustrating intermediate stages of fabrication, provided to explain a method for fabricating an image sensor according to some example embodiments.

Referring to FIG. 5, a first mask pattern M1 may be formed on a first surface 100a of the substrate 100.

Thereafter, the first trench T1 may be formed within the substrate 100 based on etching a first surface 100a of the substrate 100 in utilization of the first mask pattern M1 as a mask. Although it is illustrated in FIG. 5 that a sidewall of the first trench T1 has a slope profile, the present disclosure is not limited thereto. Such a forming of the first trench T1 may also be referred to as forming the first trench T1 on the first surface 100a of the substrate 100.

Figure 6:
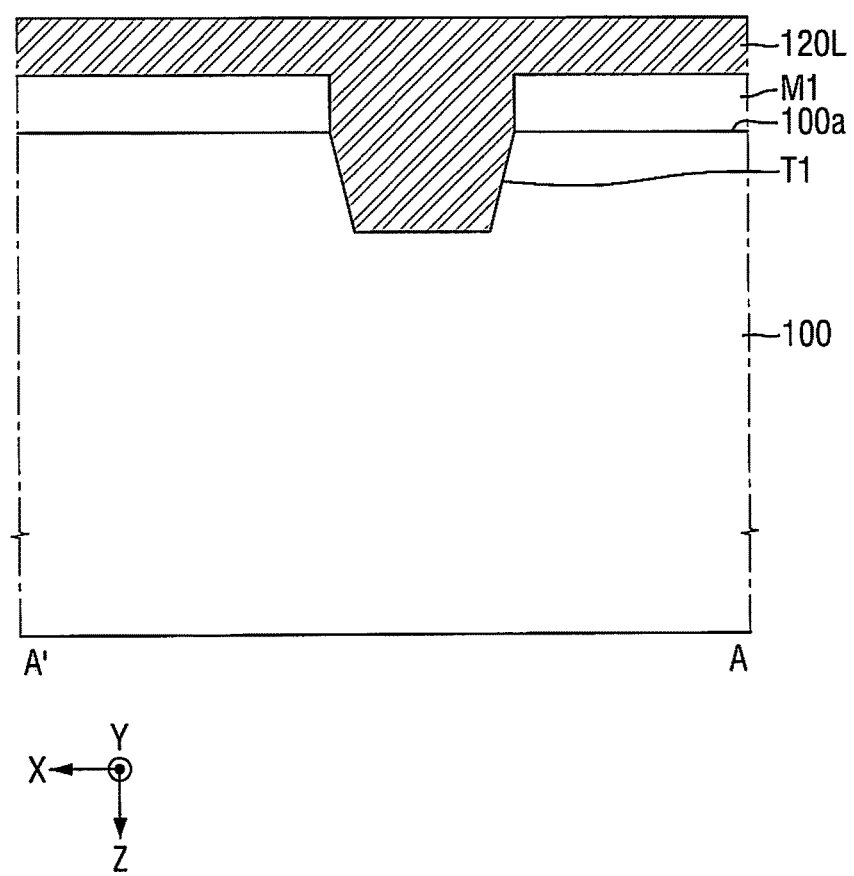

Referring to FIG. 6, a first filling layer 120L may be formed on the first mask pattern M1 and within the first trench T1.

For example, the first filling layer 120L may include silicon oxide (SiO$_2$), silicon nitride (SiN), silicon carbide (SiC), silicon oxycarbide (SiOC), silicon oxynitride (SiON), silicon oxycarbon nitride (SiOCN), or any combination thereof.

Figure 7:
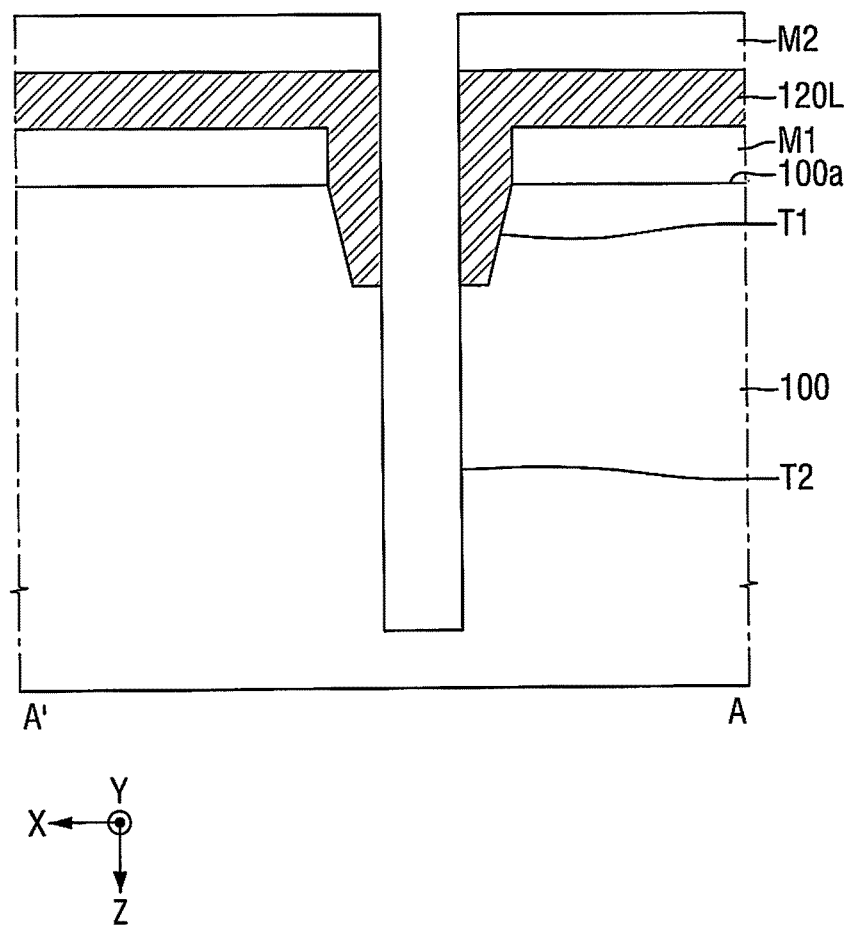

Referring to FIG. 7, a second mask pattern M2 may be formed on the first filling layer 120L and the second trench T2 may be formed within the substrate 100 by etching the first filling layer 120L and the substrate 100 in utilization of the second mask pattern M2 as a mask.

The second trench T2 may penetrate through the first filling layer 120L within the first trench T1 in the third direction Z that is orthogonal to the first surface 100a and may be formed to extend within the substrate 100 on a lower portion of the first trench T1. A width of the second trench T2 in the first direction X may be formed to be narrower than a width of the first trench T1 in the first direction X.

Figure 8:
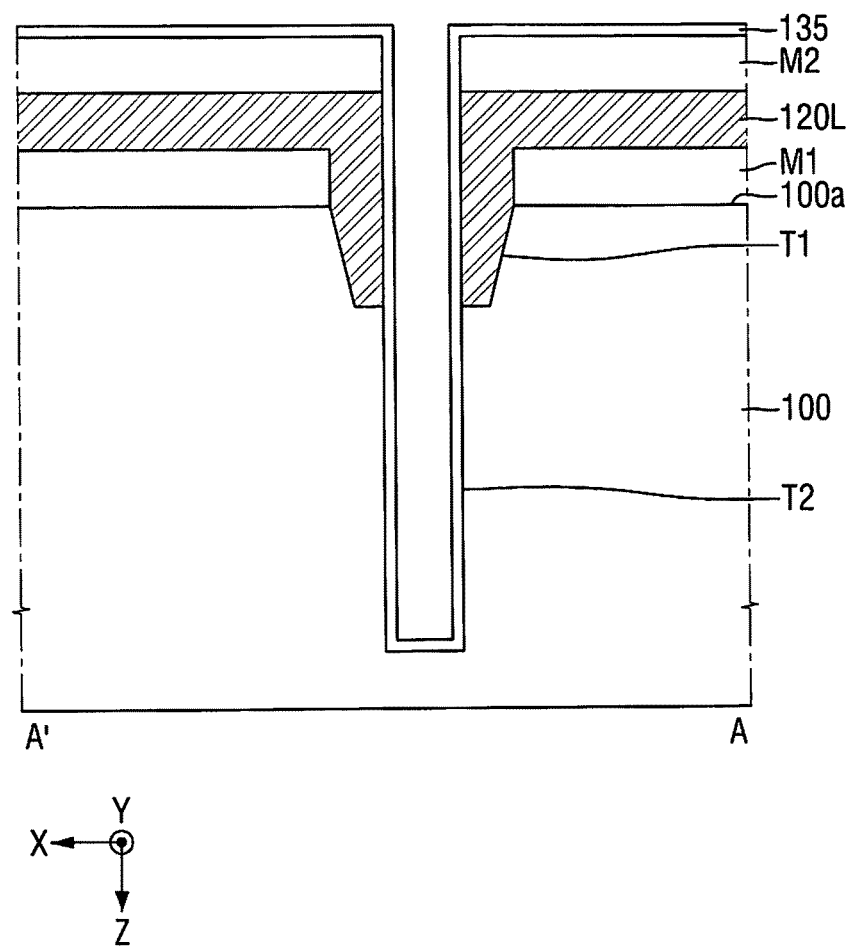

Referring to FIG. 8, the first trench passivation layer 135 including a high-k insulating material may be formed on the second mask pattern M2, a sidewall of the second trench T2, and a bottom surface of the second trench T2.

According to some example embodiments, the first trench passivation layer 135 may be formed on a sidewall of the second trench T2 and a bottom surface of the second trench T2 after the second mask pattern M2 is removed.

Although it is illustrated in FIG. 8 that the first trench passivation layer 135 is formed conformally on the second mask pattern M2, a sidewall of the second trench T2 and a bottom surface of the second trench T2, the present disclosure is not limited thereto.

Figure 9:
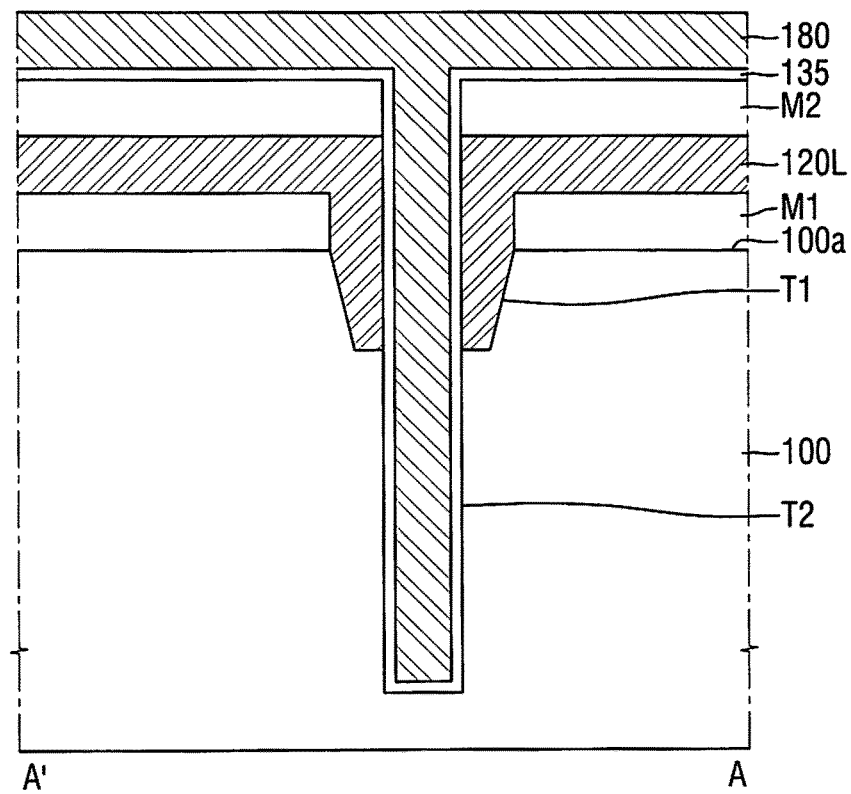

Referring to FIG. 9, a sacrificial layer 180 may be formed on the first trench passivation layer 135 so as to partially or entirely fill the second trench T2. The sacrificial layer 180 may be formed on the first trench passivation layer 135 which is formed on the second mask pattern M2.

The sacrificial layer 180 may include, for example, SOH. However, the present disclosure is not limited thereto.

Figure 10:
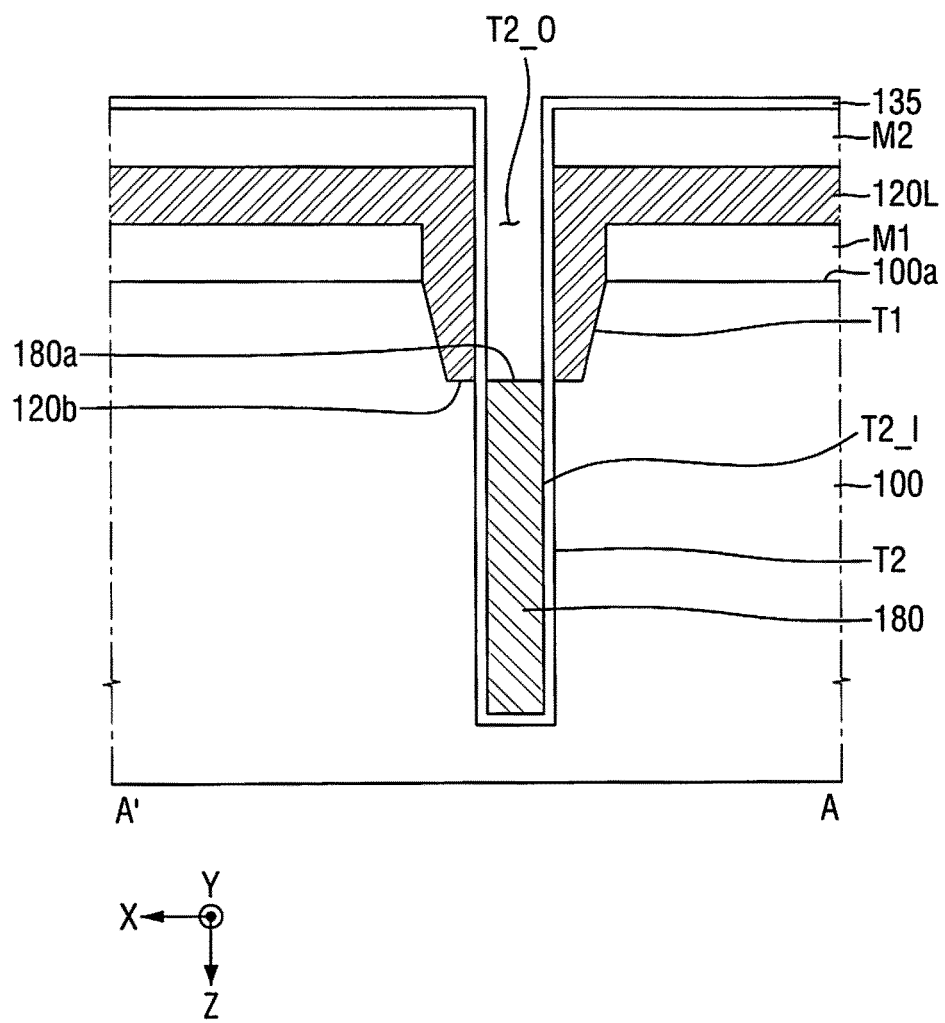

Referring to FIG. 10, at least a portion of the sacrificial layer 180 within the second trench T2 may be etched through an etch-back process. In this case, the sacrificial layer 180 formed on the second mask pattern M2 may be also etched.

After the sacrificial layer 180 is etched through the etch-back process, the sacrificial layer 180 may be present only in an inner portion T2_I of the second trench T2 and thus at least a portion (e.g., an outer portion T2_O) of the second trench T2 may be depleted of, and thus not filled by, the sacrificial layer 180 and may be exposed to an exterior of the image sensor. An upper surface 180a of the sacrificial layer 180 may be formed to be coplanar with a lower surface 120b of the first filling layer 120L. However, the present disclosure is not limited thereto.

Figure 11:
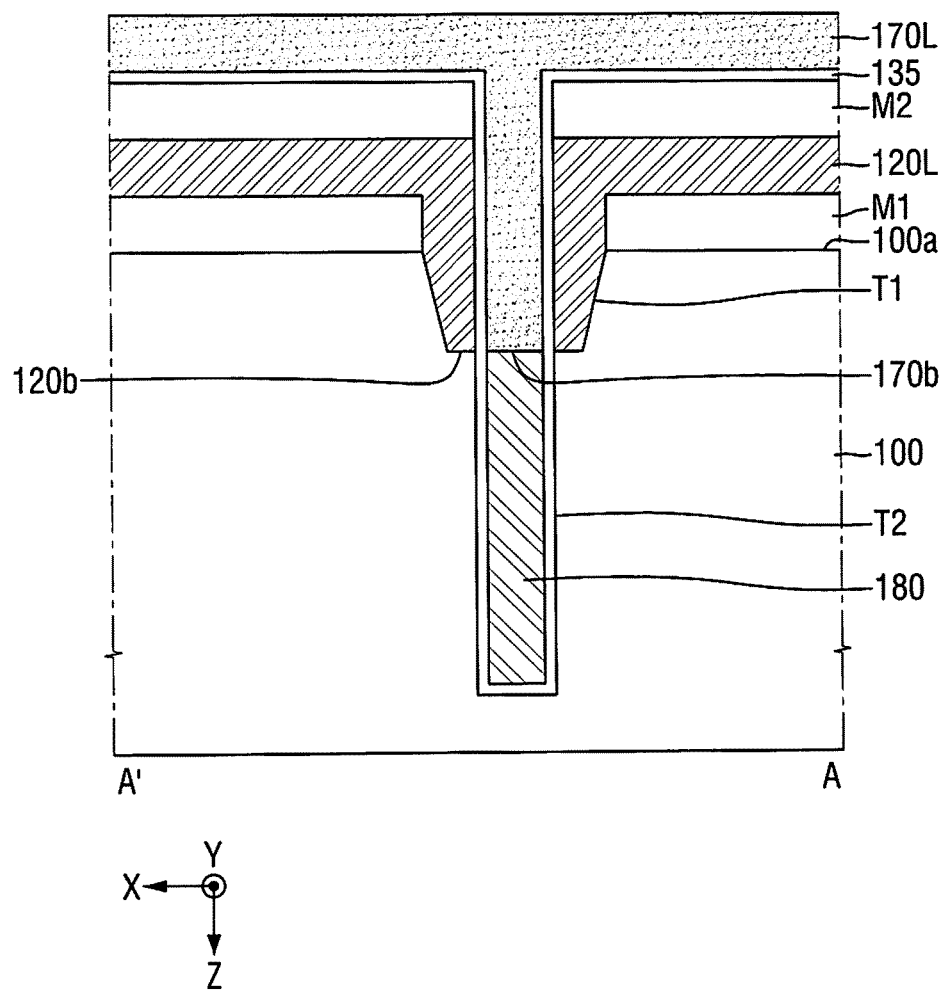

Referring to FIG. 11, a supporter layer 170L may be formed on the sacrificial layer 180 so as to fill the remainder of the second trench T2 that is not filled by the sacrificial layer (e.g., the outer portion T2_O of the second trench T2). The supporter layer 170L may be formed also on the first trench passivation layer 135 formed on the second mask pattern M2.

A surface 170b of the supporter layer 170L may be formed to be coplanar with a lower surface 120b of the first filling layer 120L. However, the present disclosure is not limited thereto.

Figure 12:
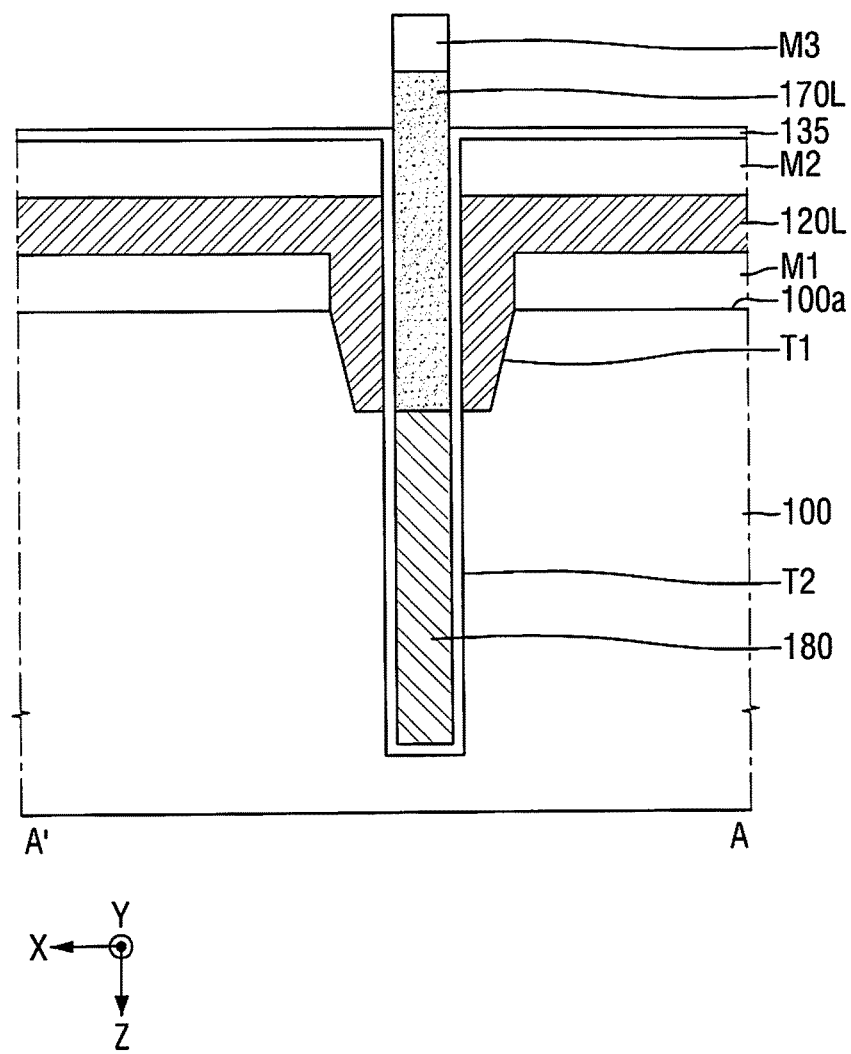

Referring to FIG. 12, the supporter layer 170L may be etched by using a third mask pattern M3 as a mask after the third mask pattern M3 is formed on the supporter layer 170L. A plane shape of the third mask pattern M3 may be same as a plane shape of the first supporter 170 illustrated in FIG. 3.

Figure 13:
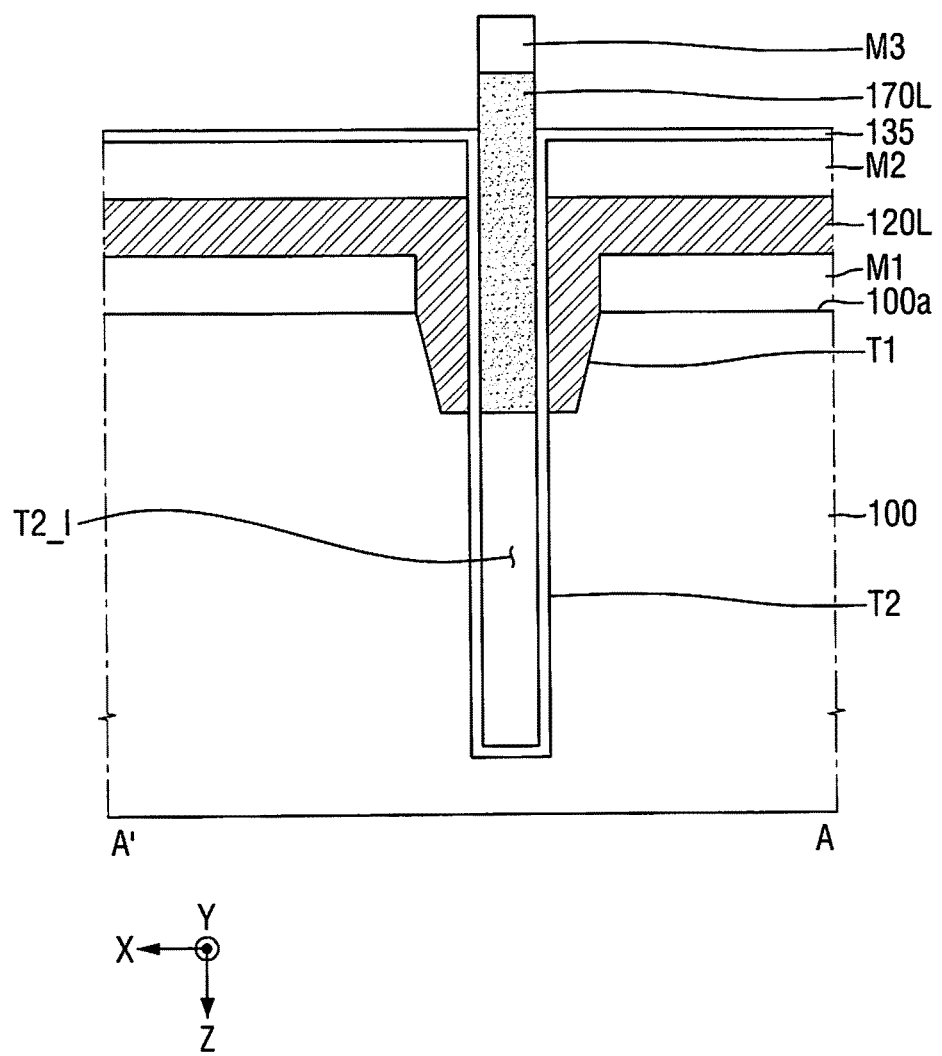

Referring to FIG. 13, the sacrificial layer 180 within the inner portion T2_I of the second trench T2 may be removed through an ashing strip process, such that the inner portion T2_I is depleted of sacrificial layer 180 and thus the second trench T2 is depleted of sacrificial layer 180. The sacrificial layer 180 may be removed through the second trench T2 of a region where the supporter layer 170L is not formed.

Figure 14:
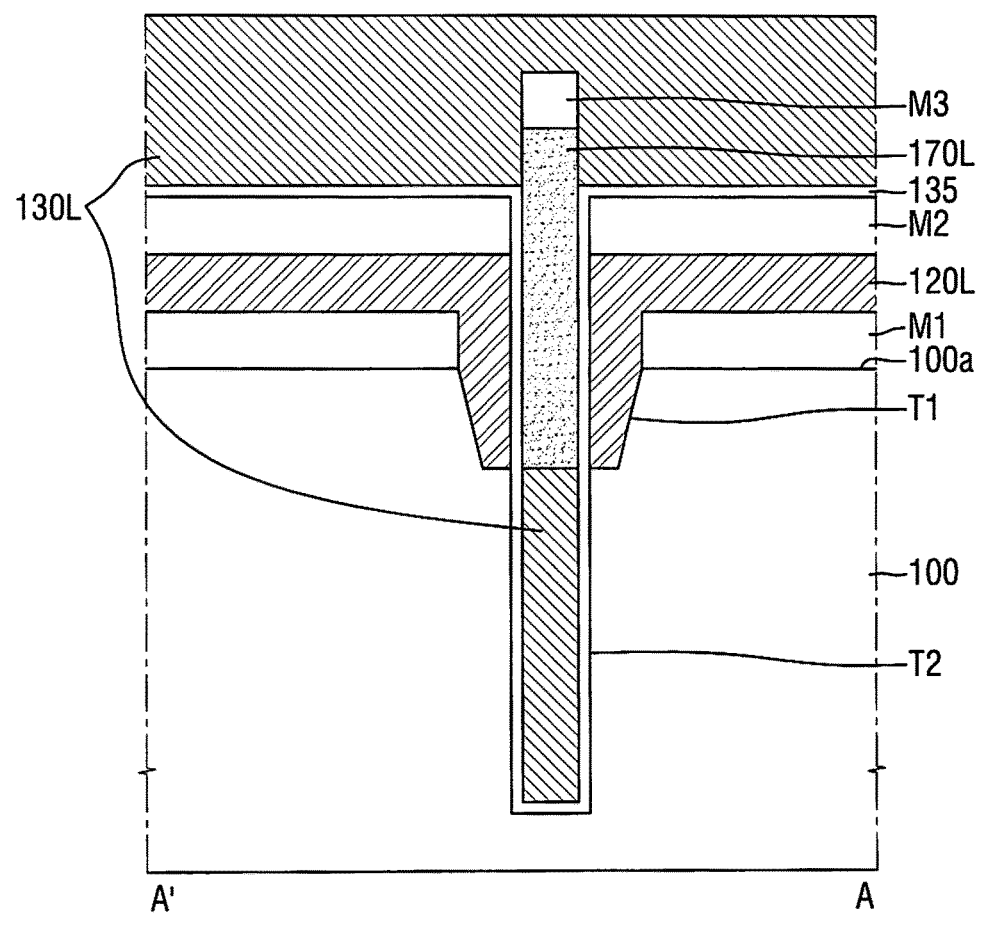

Referring to FIG. 14, the second filling layer 130L may be formed so as to fill an inner portion of the second trench T2 removed with the sacrificial layer 180. The second filling layer 130L may be formed to overlie an inner portion of the second trench T2 of a region where the supporter layer 170L is not formed, the exposed first trench passivation layer 135, the exposed supporter layer 170L, and the third mask pattern M3.

Figure 15:
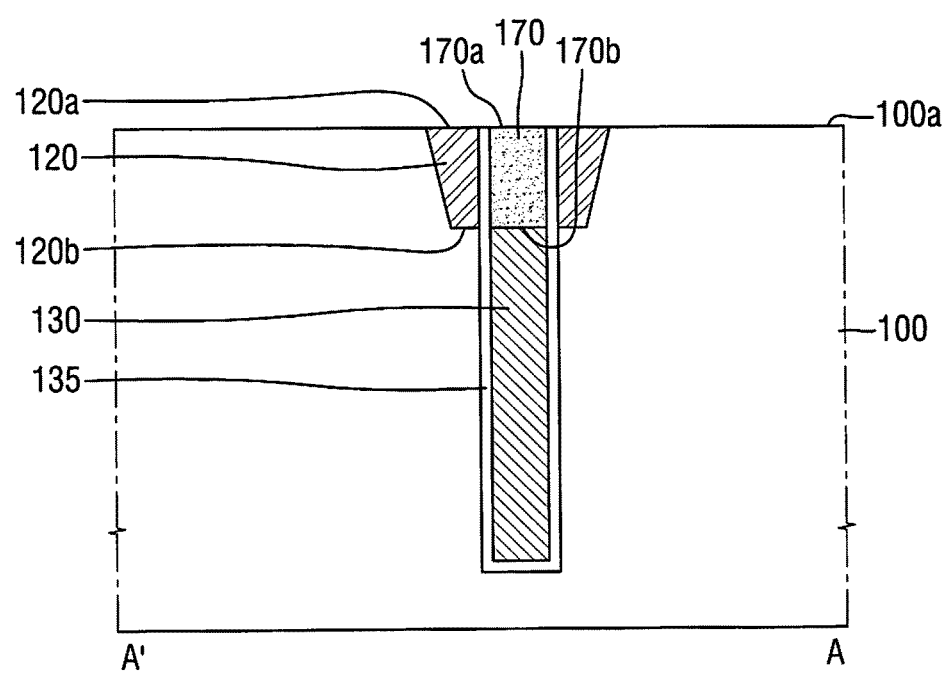
Figure 15:
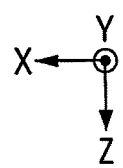

Referring to FIG. 15, performance of a planarization etching process (e.g., CMP process) may remove the second filling layer 130L formed on a first surface 100a of the substrate 100, the third mask pattern M3, the supporter layer 170L, the first trench passivation layer 135, the second mask pattern M2, the first filling layer 120L and the first mask pattern M1.

Through the planarization etching process, as illustrated in FIG. 15, the first isolation layer 120 and the first supporter 170 may be exposed from a plane same as (e.g., may have a lower surface 170a that is coplanar with) a first surface 100a of the substrate 100. Accordingly, the supporter 170 may be formed based on etching a portion of the supporter layer 170L prior to forming photoelectric conversion devices PD within the substrate 100.

Through such process, the first isolation layer 120 may be formed within the first trench T1, and the second isolation layer 130 and the first supporter 170 may be respectively formed within the second trench T2.

Figure 16:
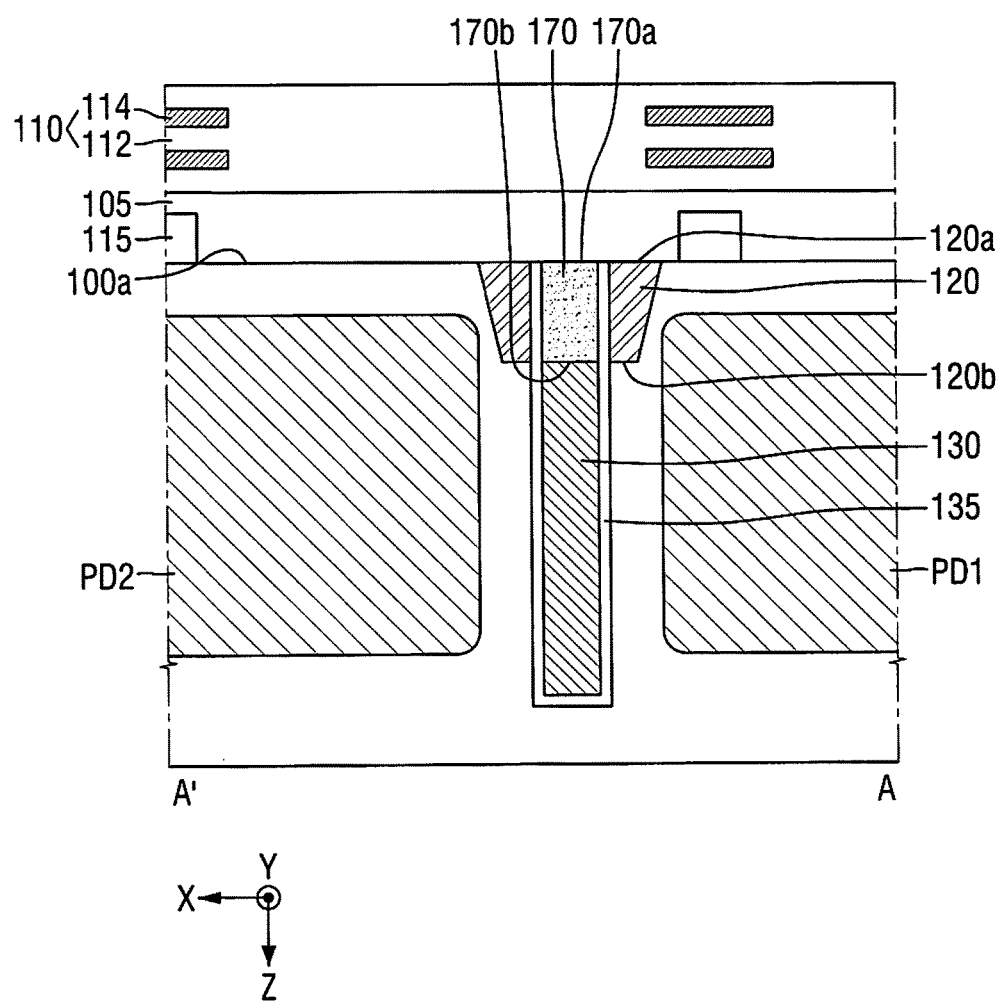

Referring to FIG. 16, a plurality of photoelectric conversion devices PD may be formed on both sides (e.g., opposite sides) of the first isolation layer 120 and the second isolation layer 130 within the substrate 100. A plurality of photoelectric conversion devices PD may be formed through an ion implantation process.

Thereafter, a plurality of gates 115 may be formed on a first surface 100a of the substrate 100. In this case, each of the plurality of gates 115 may be formed so as not to overlap the first isolation layer 120. Accordingly, the first isolation layer 120 may be disposed between the plurality of gates 115. The gates may be formed subsequently to forming the photoelectric conversion devices PD.

Thereafter, the insulating layer 105 may be formed so as to overlie a first surface 100a of the substrate 100, a plurality of gates 115, the first isolation layer 120 and the first supporter 170. In this case, referring to FIG. 3, the insulating layer 105 may be formed also on the second isolation layer 130 within the second trench T2 where the first supporter 170 is not formed.

Thereafter, the insulating structure 110 including the interlayer insulating layer 112 and the metal wire 114 may be formed on the insulating layer 105.

Figure 17:
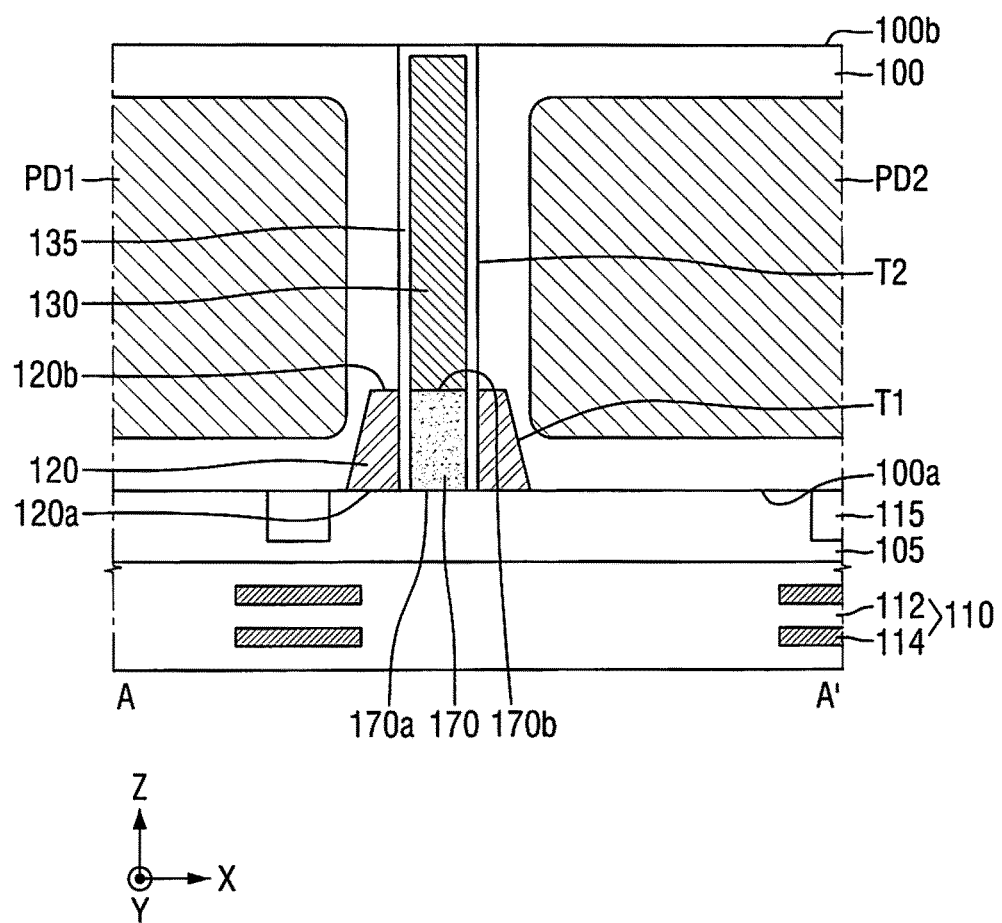

Referring to FIG. 17, a portion of the substrate 100 may be removed in order to reduce thickness of the substrate 100. In this case, after a second surface 100b of the substrate 100 directs upwardly by overturning the substrate 100, a portion of the substrate 100 may be removed by performing the planarization etching process (e.g., CMP process). Through the planarization etching process of removing a portion of the substrate 100, the first trench passivation layer 135 formed within the second trench T2 may be exposed from a plane same as a second surface 100b of the substrate 100.

Referring to FIG. 4, a passivation layer 138 may be formed on a second surface 100b of the substrate 100. For example, the passivation layer 138 may be formed by using any one of atomic layer deposition (ALD), physical vapor deposition (PVD), and chemical vapor deposition (CVD). Thereafter, the planarization layer 140 may be formed on the passivation layer 138.

After the planarization layer 140 is formed, the image sensor illustrated in FIG. 4 may be fabricated by forming the color filter 150 and the microlens 160 on the planarization layer 140.

Hereinbelow, an image sensor according to some example embodiments will be described with reference to FIG. 18. The description will be made with the main focus on the differences from the image sensor illustrated in FIG. 4.

Figure 18:
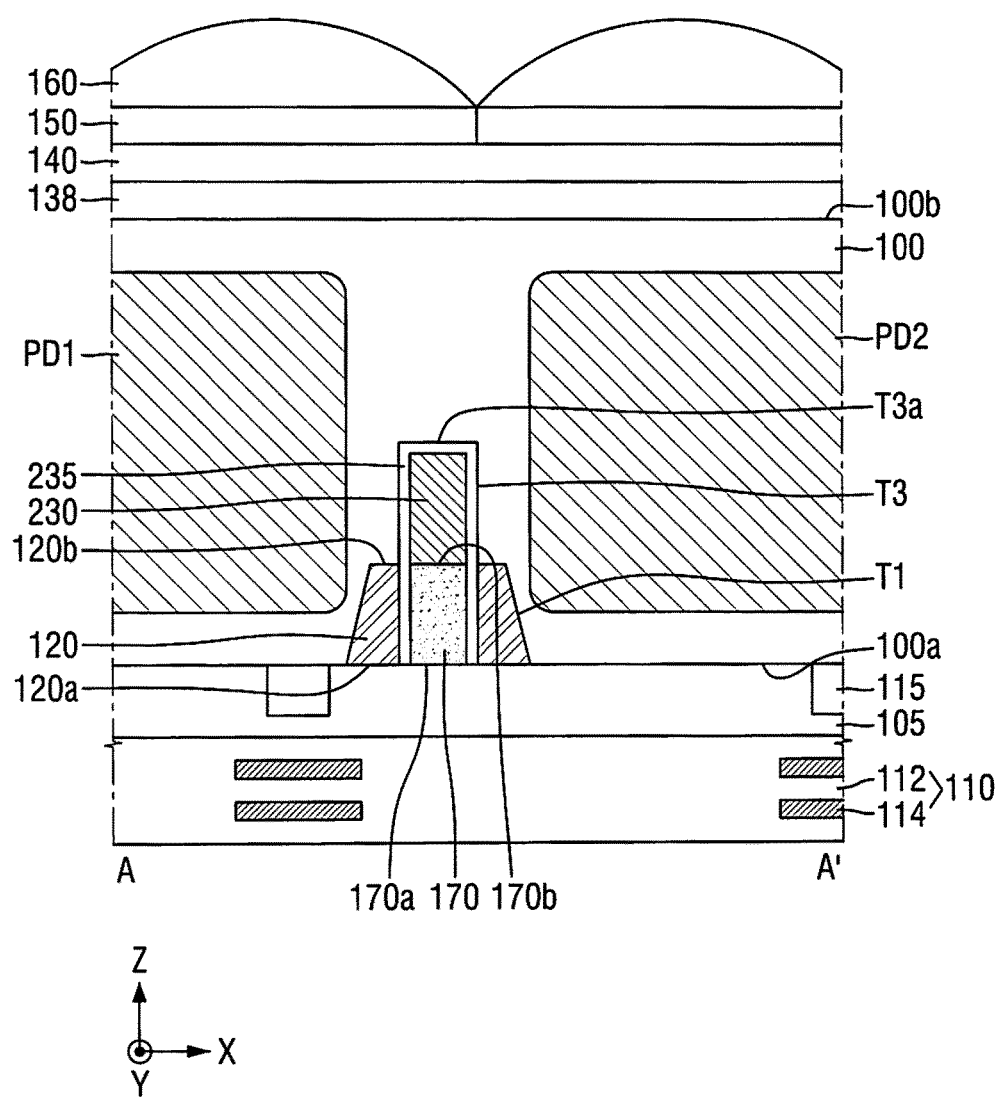
FIG. 18 is a cross-sectional view provided to explain an image sensor according to some example embodiments.

FIG. 18 is a cross-sectional view provided to explain an image sensor according to some example embodiments.

Referring to FIG. 18, in the image sensor according to some example embodiments, a third trench T3 where the second isolation layer 230 is formed may extend only to a certain region of the substrate 100. That is, an upper surface T3a of the third trench T3 may be formed within the substrate 100 such that the upper surface T3a does not expose an opening in a surface that is opposite to the surface from which the third trench T3 extends. For example, as shown in FIG. 18, the upper surface T3a is within the substrate 100, such that the upper surface T3a does not expose an opening in the second surface 100b.

The first trench passivation layer 235 may be disposed along a sidewall and an upper portion of the third trench T3 within the third trench T3.

Hereinbelow, an image sensor according to some example embodiments will be described with reference to FIG. 19. The description will be made with the main focus on the differences from the image sensor illustrated in FIG. 4.

Figure 19:
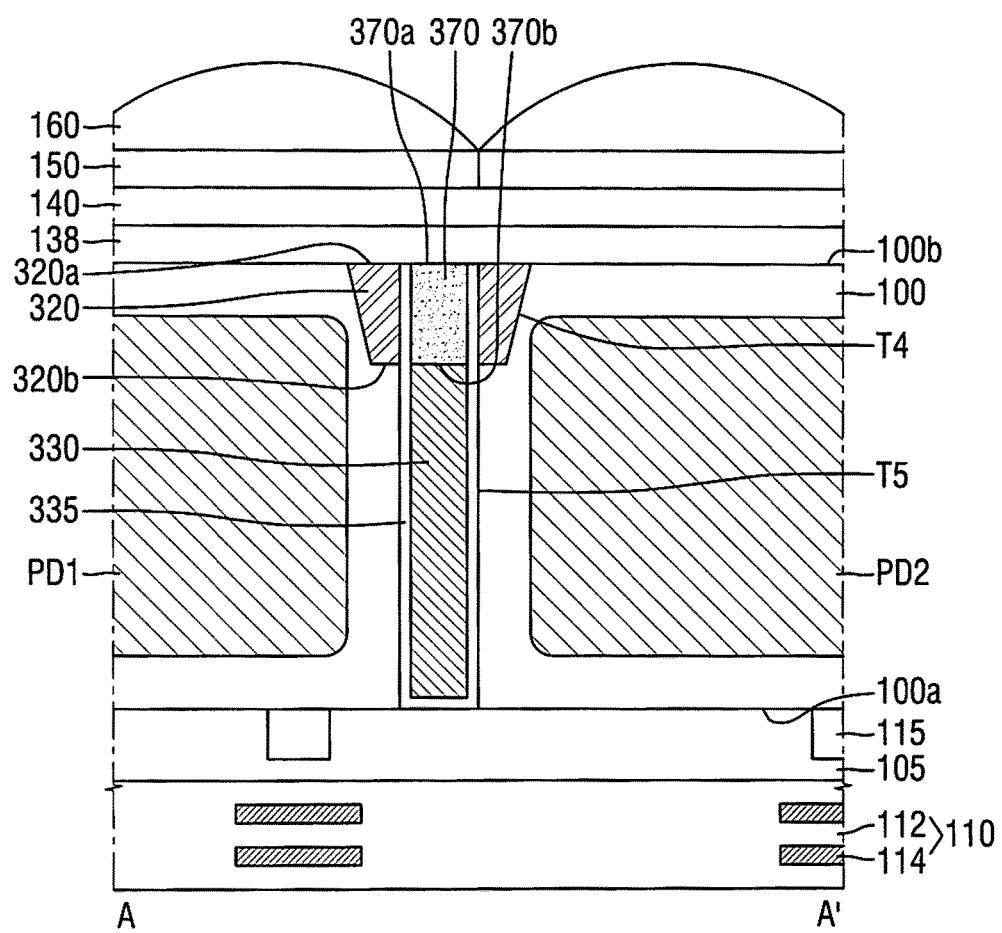
FIG. 19 is a cross-sectional view provided to explain an image sensor according to some example embodiments.

FIG. 19 is a cross-sectional view provided to explain an image sensor according to some example embodiments.

Referring to FIG. 19, in the image sensor according to some example embodiments, the first isolation layer 320 and the first supporter 370 may be disposed on a second surface 100b of the substrate 100.

A fourth trench T4 formed with the first isolation layer 320 and the first supporter 370 may be formed to extend within the substrate 100 from a second surface 100b of the substrate 100. A fifth trench T5 formed with the second isolation layer 330 may penetrate through the first isolation layer 320 from a second surface 100b of the substrate 100 and extend in a first surface 100a of the substrate 100.

The first trench passivation layer 335 may be disposed along a sidewall and a bottom surface of the fifth trench T5 within the fifth trench T5.

A second surface 100b of the substrate 100, an upper surface 320a of the first isolation layer 320, and an upper surface 370a of the first supporter 370 may be formed to be coplanar with one another. Further, a lower surface 320b of the first isolation layer 320 and a lower surface 370b of the first supporter 370 may be formed to be coplanar with each other. It will be understood that elements that are "coplanar" with each other, as used herein, includes elements that are coplanar with each other within manufacturing tolerances and/or material tolerances.

The plurality of gates 115 may be formed on a first surface 100a of the substrate 100 opposite a second surface 100b of the substrate 100 formed with the fourth trench T4.

It will be understood that, as described herein, an element that is "on" another element may be above or beneath the other element, and that an element that is "on" another element may directly contact the other element or may be isolated from direct contact with the other element by one or more interposing spaces and/or structures.

Hereinbelow, an image sensor according to some example embodiments will be described with reference to FIG. 20. The description will be made with the main focus on the differences from the image sensor illustrated in FIG. 4.

Figure 20:
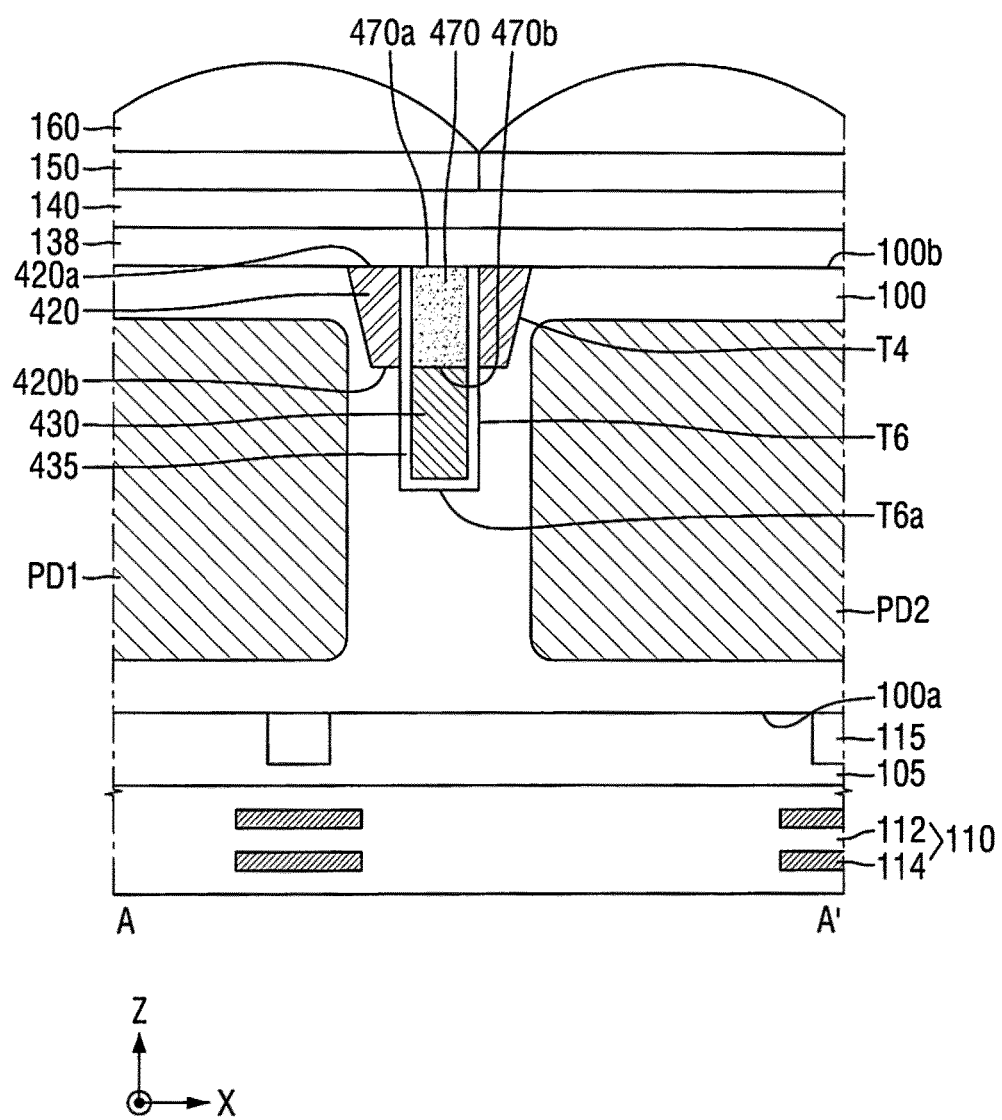
FIG. 20 is a cross-sectional view provided to explain an image sensor according to some example embodiments.

FIG. 20 is a cross-sectional view provided to explain an image sensor according to some example embodiments.

Referring to FIG. 20, in the image sensor according to some example embodiments, the first isolation layer 420 and the first supporter 470 may be disposed on a second surface 100b of the substrate 100.

As shown in FIG. 20, the fourth trench T4 formed with the first isolation layer 420 and the first supporter 470 may be formed to extend within the substrate 100 from a second surface 100b of the substrate 100 in the third direction Z and between adjacent photoelectric conversion devices PD. A sixth trench T6 formed with the second isolation layer 430 may extend only to a certain region of the substrate 100. That is, a lower surface T6a of the sixth trench T6 may be formed within the substrate 100 such that the lower surface T6a does not expose an opening in a surface that is opposite to the surface from which the sixth trench T6 extends. For example, as shown in FIG. 20, the lower surface T6a is within the substrate 100, such that the lower surface T6a does not expose an opening in the first surface 100a. As shown in at least FIG. 20, the sixth trench T6 may be formed on a lower portion of the fourth trench T4 (e.g., on a surface of the fourth trench T4 that is distal from the second surface 100b) and may extend from the lower portion of the fourth trench T4 and away from the second surface 100b and into the interior of the substrate 100 in the third direction Z.

The first trench passivation layer 435 may be disposed along a sidewall and a bottom surface of the sixth trench T6 within the sixth trench T6.

A second surface 100b of the substrate 100, an upper surface 420a of the first isolation layer 420 and an upper surface 470a of the first supporter 470 may be formed to be coplanar with one another. Further, a lower surface 420b of the first isolation layer 420 and a lower surface 470b of the first supporter 470 may be formed to be coplanar with each other.

Hereinbelow, an image sensor according to some example embodiments will be described with reference to FIG. 21. The description will be made with the main focus on the differences from the image sensor illustrated in FIG. 4.

Figure 21:
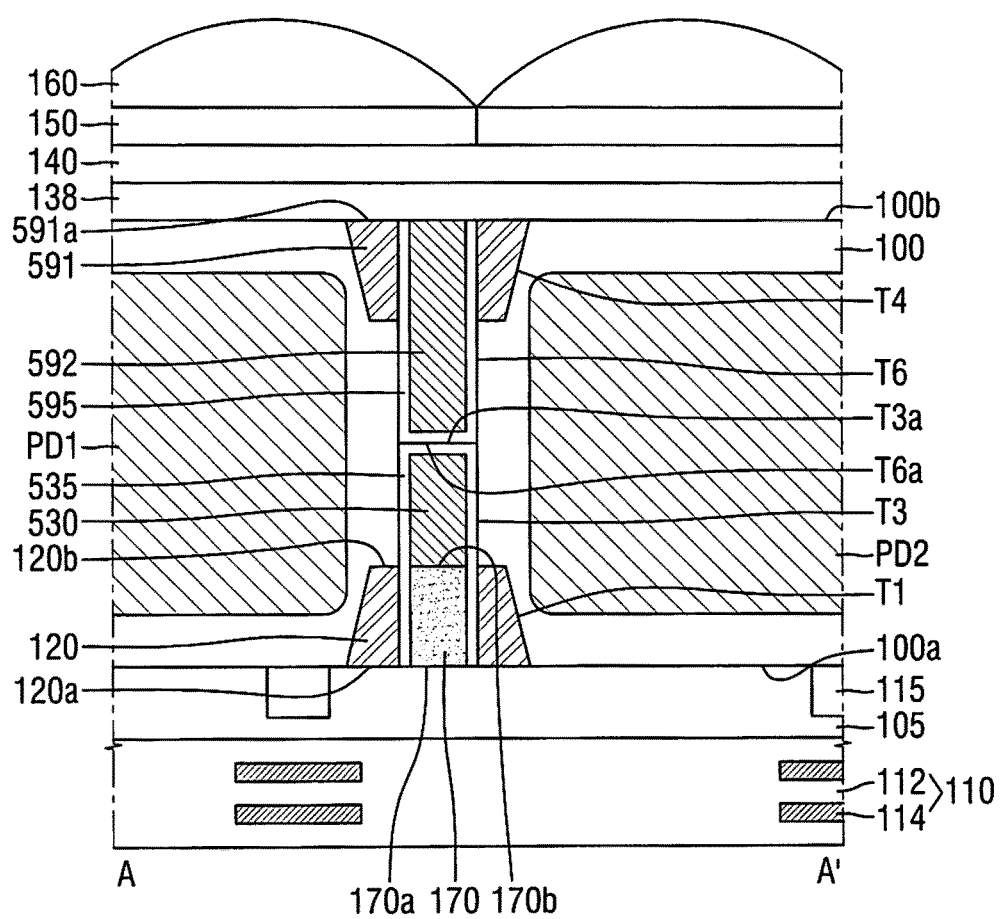
FIG. 21 is a cross-sectional view provided to explain an image sensor according to some example embodiments.
Figure 21:
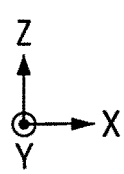

FIG. 21 is a cross-sectional view provided to explain an image sensor according to some example embodiments.

Referring to FIG. 21, in the image sensor according to some example embodiments, the third trench T3 formed with the second isolation layer 530 may extend only to a certain region of the substrate 100 from a first surface 100a of the substrate 100. That is, an upper surface T3a of the third trench T3 may be formed within the substrate 100.

The first trench passivation layer 535 may be disposed along a sidewall and an upper portion of the third trench T3 within the third trench T3.

A third isolation layer 591 may be disposed on a second surface 100b of the substrate 100. The fourth trench T4 formed with the third isolation layer 591 may be formed to extend within the substrate 100 from a second surface 100b of the substrate 100. The sixth trench T6 formed with a fourth isolation layer 592 may extend only to a certain region of the substrate 100 from a second surface 100b of the substrate 100. That is, a lower surface T6a of the sixth trench T6 may be formed within the substrate 100. As shown in at least FIG. 21, the third isolation layer 591 may be within the fourth trench T4 and the fourth isolation layer 592 may be within the sixth trench T6. The fourth isolation layer 592 may be between the third isolation layer 591 and the second isolation layer 530.

The third trench T3 and the sixth trench T6 may be formed so as to overlap each other in the third direction Z. As shown in at least FIG. 21, an upper surface T3a of the third trench T3 may be formed to be in contact with a lower surface T6a of the sixth trench T6.

The second trench passivation layer 595 may be disposed along a sidewall and a bottom surface of the sixth trench T6 within the sixth trench T6. A second surface 100b of the substrate 100 and an upper surface 591a of the third isolation layer 591 may be formed to be coplanar with each other.

Hereinbelow, an image sensor according to some example embodiments will be described with reference to FIG. 22. The description will be made with the main focus on the differences from the image sensor illustrated in FIG. 4.

Figure 22:
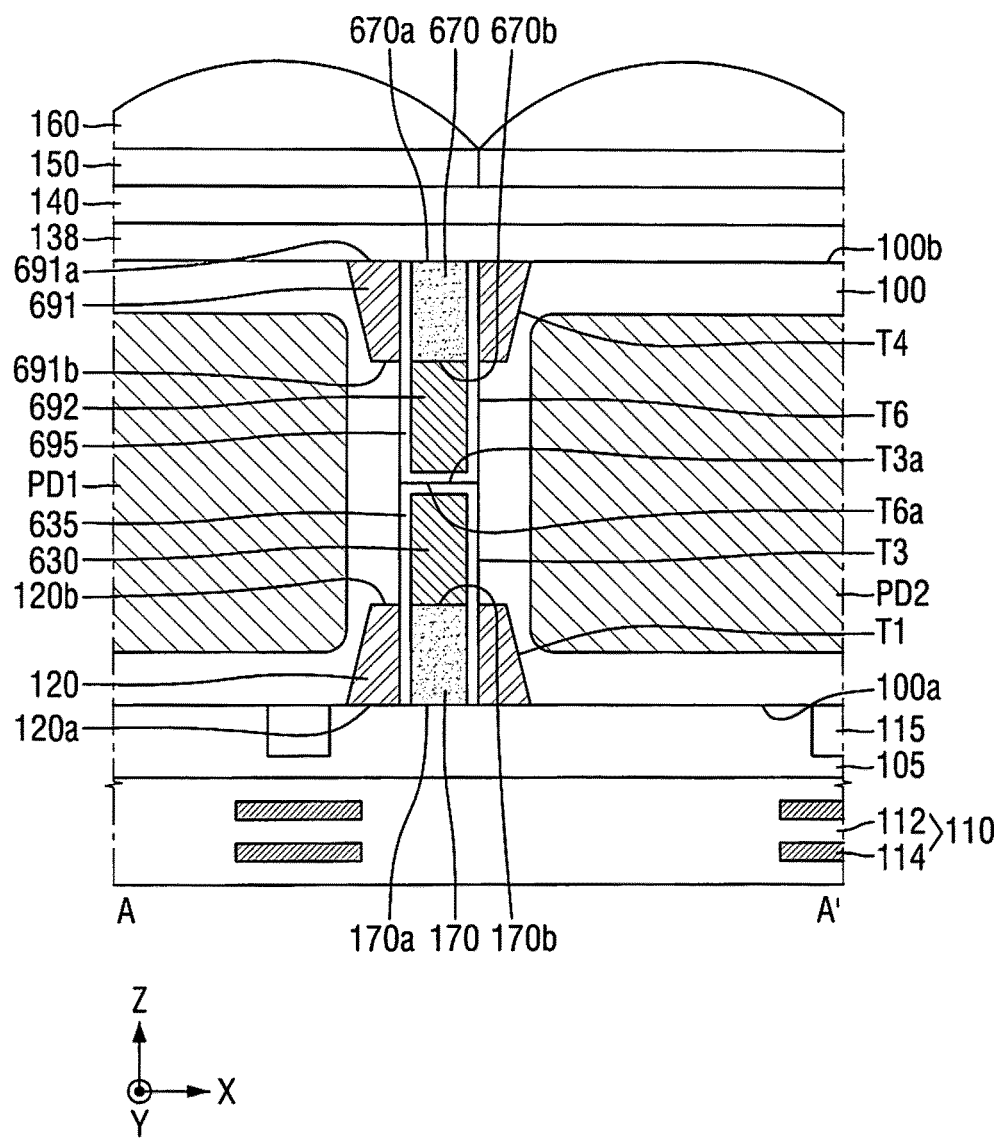
FIG. 22 is a cross-sectional view provided to explain an image sensor according to some example embodiments.

FIG. 22 is a cross-sectional view provided to explain an image sensor according to some example embodiments.

Referring to FIG. 22, in the image sensor according to some example embodiments, the third trench T3 formed with the second isolation layer 630 may extend only to a certain region of the substrate 100 from a first surface 100a of the substrate 100. That is, an upper surface T3a of the third trench T3 may be formed within the substrate 100.

The first trench passivation layer 635 may be disposed along a sidewall and an upper portion of the third trench T3 within the third trench T3.

The third isolation layer 691 may be disposed on a second surface 100b of the substrate 100. The third isolation layer 691 may be between adjacent photoelectric conversion devices PD and may be exposed from the second surface 100b of the substrate 100. The fourth trench T4 formed with the third isolation layer 691 and the second supporter 670 may be formed to extend within the substrate 100 from a second surface 100b of the substrate 100. The sixth trench T6 formed with the fourth isolation layer 692 may extend only to a certain region of the substrate 100 from a second surface 100b of the substrate 100. That is, a lower surface T6a of the sixth trench T6 may be formed within the substrate 100. As shown, the second supporter 670 may be within the sixth trench T6 such that the second supporter 670 does not extend through at least a plane defined by the second surface 100b. The fourth isolation layer 692 may be between the third isolation layer 691 and the second isolation layer 630.

The third trench T3 and the sixth trench T6 may be formed so as to overlap each other in the third direction Z. An upper surface T3a of the third trench T3 may be formed to be in contact with a lower surface T6a of the sixth trench T6.

The second trench passivation layer 695 may be disposed along a sidewall and a bottom surface of the sixth trench T6 within the sixth trench T6. A second surface 100b of the substrate 100, an upper surface 691a of the third isolation layer 691, and an upper surface 670a of the second supporter 670 may be formed to be coplanar with one another. Further, a lower surface 691b of the third isolation layer 691 and a lower surface 670b of the second supporter 670 may be formed to be coplanar with each other.

Hereinbelow, an image sensor according to some example embodiments will be described with reference to FIG. 23. The description will be made with the main focus on the differences from the image sensor illustrated in FIG. 4.

Figure 23:
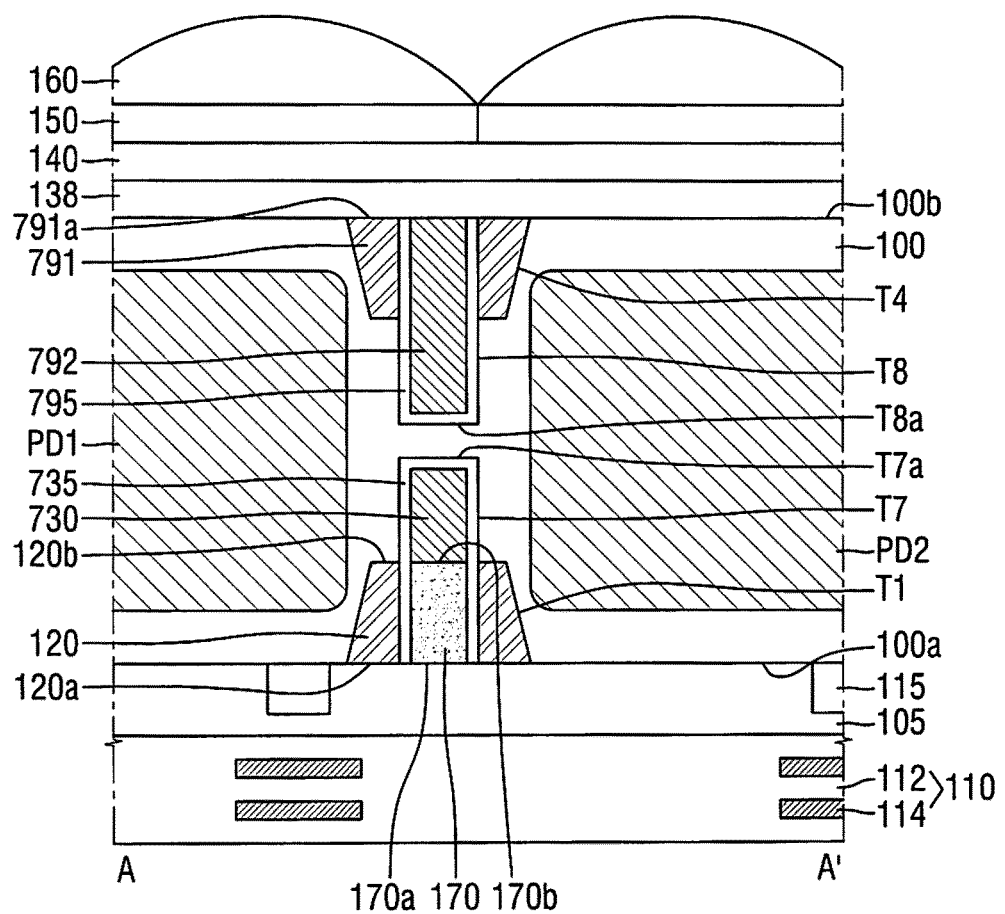
FIG. 23 is a cross-sectional view provided to explain an image sensor according to some example embodiments.
Figure 23:
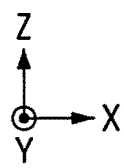

FIG. 23 is a cross-sectional view provided to explain an image sensor according to some example embodiments.

Referring to FIG. 23, in the image sensor according to some example embodiments, a seventh trench T7 formed with the second isolation layer 730 may extend only to a certain region of the substrate 100 from a first surface 100a of the substrate 100. That is, an upper surface T7a of the seventh trench T7 may be formed within the substrate 100.

The first trench passivation layer 735 may be disposed along a sidewall and an upper portion of the seventh trench T7 within the seventh trench T7.

The third isolation layer 791 may be disposed on a second surface 100b of the substrate 100. The fourth trench T4 formed with the third isolation layer 791 may be formed to extend within the substrate 100 from a second surface 100b of the substrate 100. An eighth trench T8 formed with the fourth isolation layer 792 may extend only to a certain region of the substrate 100 from a second surface 100b of the substrate 100. That is, a lower surface T8a of the eighth trench T8 may be formed within the substrate 100. The fourth isolation layer 792 may be between the third isolation layer 791 and the second isolation layer 730.

The seventh trench T7 and the eighth trench T8 may be formed so as to overlap each other in the third direction Z. As shown in at least FIG. 23, an upper surface T7a of the seventh trench T7 may be formed to be spaced apart from (e.g., isolated from direct contact with) a lower surface T8a of the eighth trench T8. That is, the substrate 100 may be disposed between an upper surface T7a of the seventh trench T7 and a lower surface T8a of the eighth trench T8 and thus may be between the second isolation layer 730 and the fourth isolation layer 792.

The second trench passivation layer 795 may be disposed along a sidewall and a bottom surface of the eighth trench T8 within the eighth trench T8. A first surface 100a of the substrate 100 and an upper surface 791a of the third isolation layer 791 may be formed to be coplanar with each other.

Hereinbelow, an image sensor according to some example embodiments will be described with reference to FIG. 24. The description will be made with the main focus on the differences from the image sensor illustrated in FIG. 4.

Figure 24:
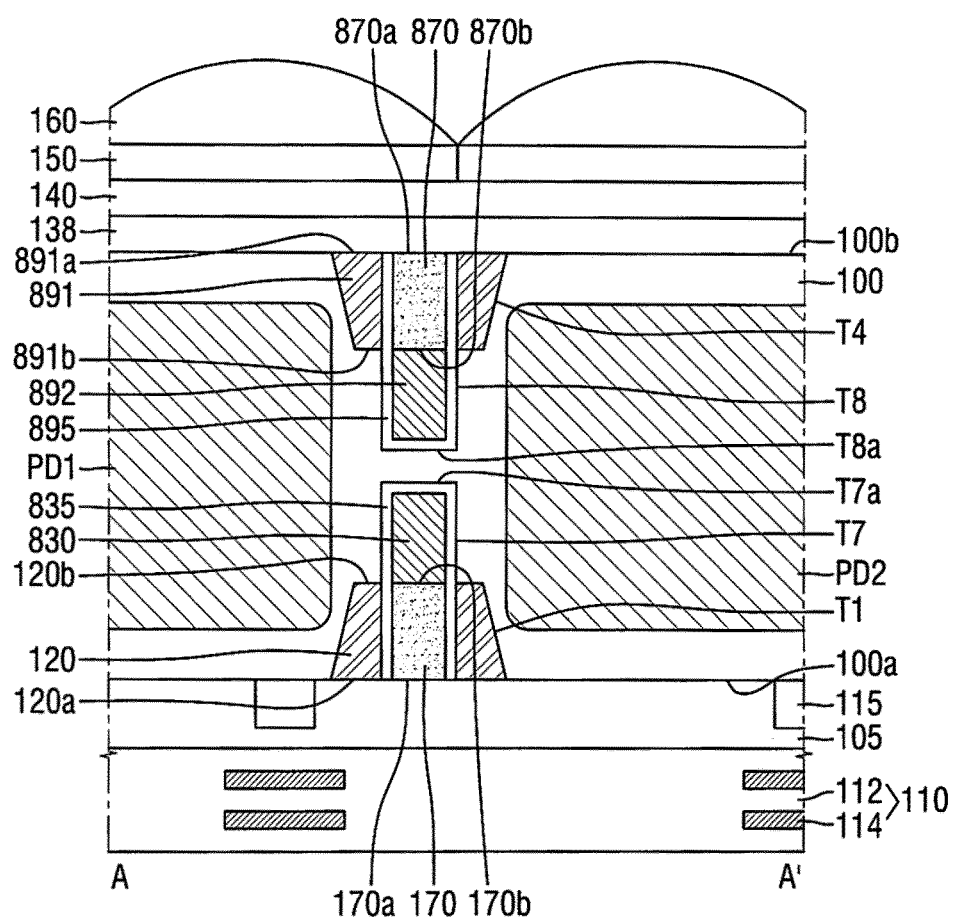
FIG. 24 is a cross-sectional view provided to explain an image sensor according to some example embodiments.

FIG. 24 is a cross-sectional view provided to explain an image sensor according to some example embodiments.

Referring to FIG. 24, in the image sensor according to some example embodiments, the seventh trench T7 formed with the second isolation layer 830 may extend only to a certain region of the substrate 100 from a first surface 100a of the substrate 100. That is, a lower surface T8a of the eighth trench T8 may be formed within the substrate 100.

The first trench passivation layer 835 may be disposed along a sidewall and an upper portion of the seventh trench T7 within the seventh trench T7.

The third isolation layer 891 may be disposed on a second surface 100b of the substrate 100. The fourth trench T4 formed with the third isolation layer 891 and the second supporter 870 may be formed to extend within the substrate 100 from a second surface 100b of the substrate 100. As shown, the second supporter 870 may be within the eighth trench T8 such that the second supporter 870 does not extend through at least a plane defined by the second surface 100b. The eighth trench T8 formed with the fourth isolation layer 892 may extend only to a certain region of the substrate 100 from a second surface 100b of the substrate 100. That is, a lower surface T8a of the eighth trench T8 may be formed within the substrate 100. The fourth isolation layer 892 may be between the third isolation layer 891 and the second isolation layer 830.

The seventh trench T7 and the eighth trench T8 may be formed so as to overlap each other in the third direction Z. An upper surface T7a of the seventh trench T7 may be formed to be spaced apart from a lower surface T8a of the eighth trench T8. That is, the substrate 100 may be disposed between an upper surface T7a of the seventh trench T7 and a lower surface T8a of the eighth trench T8 and thus may be between the second isolation layer 830 and the fourth isolation layer 892.

The second trench passivation layer 895 may be disposed along a sidewall and a bottom surface of the eighth trench T8 within the eighth trench T8. A second surface 100b of the substrate 100, an upper surface 891a of the third isolation layer 891 and an upper surface 870a of the second supporter 870 may be formed to be coplanar with one another. Further, a lower surface 891b of the third isolation layer 891 and a lower surface 870b of the second supporter 870 may be formed to be coplanar with each other.

Hereinbelow, an image sensor according to some example embodiments will be described with reference to FIG. 25. The description will be made with the main focus on the differences from the image sensor illustrated in FIG. 4.

Figure 25:
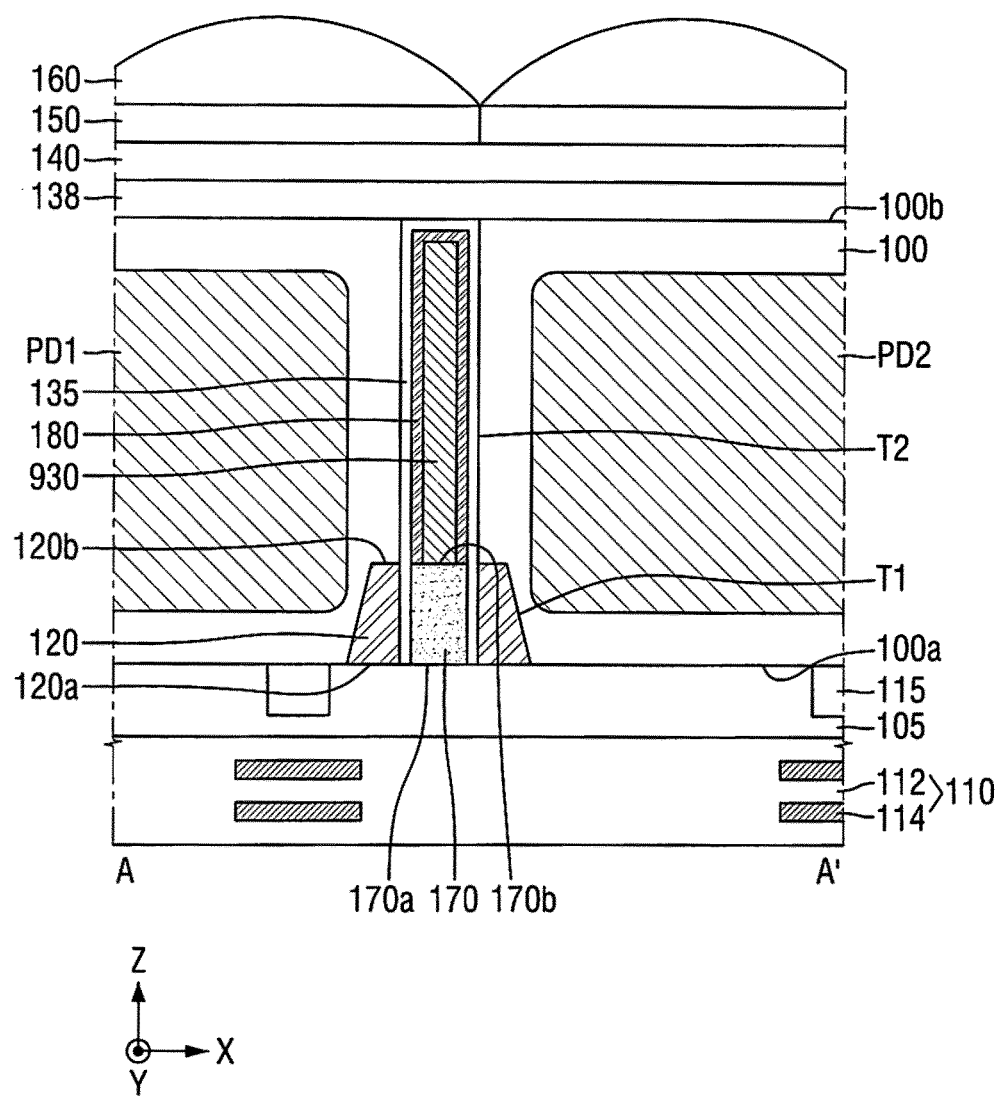
FIG. 25 is a cross-sectional view provided to explain an image sensor according to some example embodiments.

FIG. 25 is a cross-sectional view provided to explain an image sensor according to some example embodiments.

Referring to FIG. 25, the image sensor according to some example embodiments may include the sacrificial layer 180 disposed along (e.g., covering) an inner wall of the second trench T2.

Specifically, the sacrificial layer 180 may be disposed on the first trench passivation layer 135 disposed within the second trench T2. However, the sacrificial layer 180 may not be disposed between the first trench passivation layer 135 and the first supporter 170.

The second isolation layer 930 may be disposed to fill an inner portion of the second trench T2 on the sacrificial layer 180.

Hereinbelow, an image sensor according to some example embodiments will be described with reference to FIG. 26. The description will be made with the main focus on the differences from the image sensor illustrated in FIG. 3.

Figure 26:
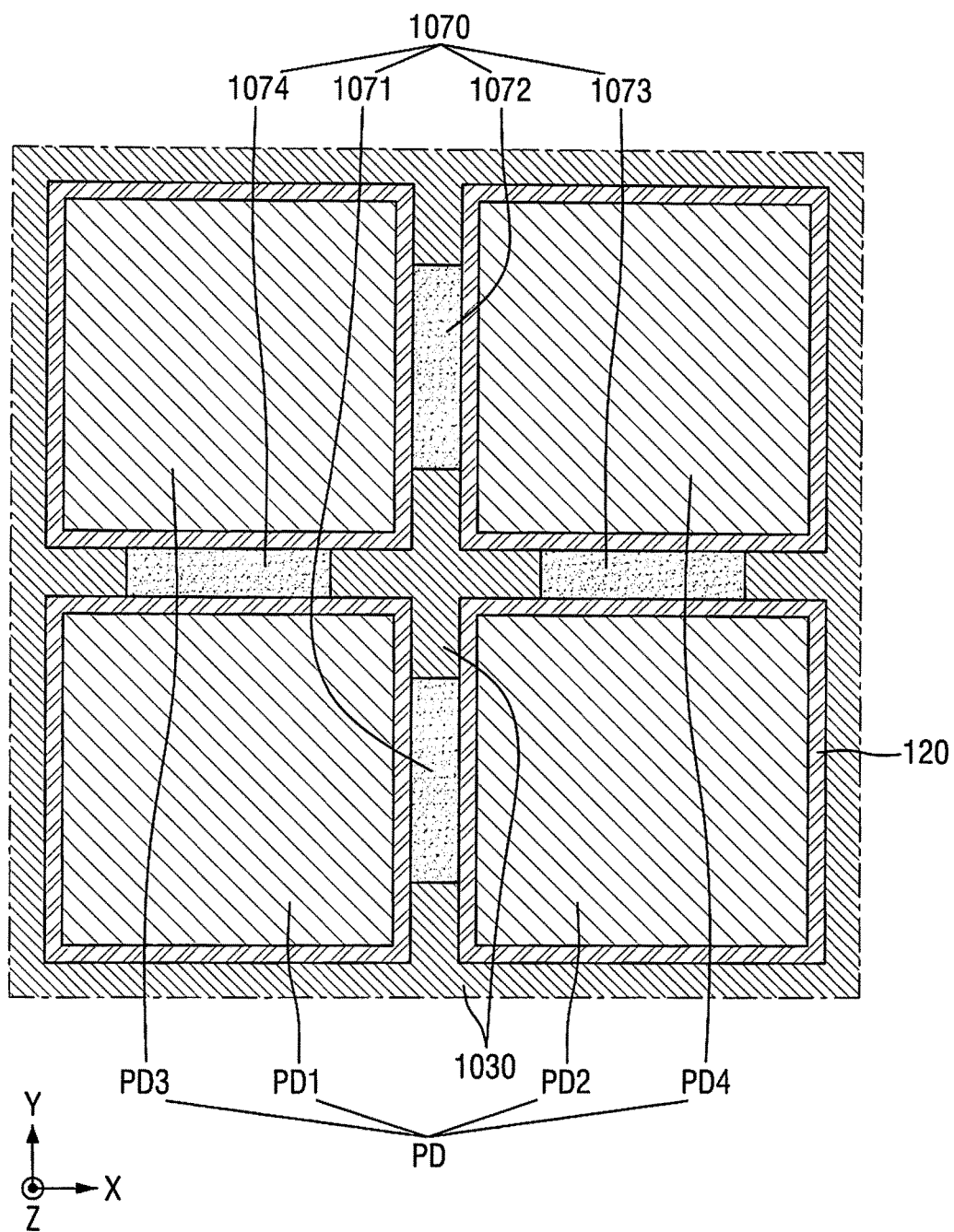
FIG. 26 is a view provided to explain an image sensor according to some example embodiments.

FIG. 26 is a cross-sectional view provided to explain an image sensor according to some example embodiments.

Referring to FIG. 26, in the image sensor according to some example embodiments, the first supporter 1070 may include first to fourth portions 1071, 1072, 1073, 1074 which are disposed between each of the plurality of photoelectric conversion devices PD.

The second isolation layer 1030 may be disposed between a first portion 1071 of the first supporter 1070 and a second portion 1072 of the first supporter 1070. That is, a first portion 1071 of the first supporter 1070 may not connect with a second portion 1072 of the first supporter 1070.

The second isolation layer 1030 may be disposed between a third portion 1073 of the first supporter 1070 and a fourth portion 1074 of the first supporter 1070. That is, a third portion 1073 of the first supporter 1070 may not connect with a fourth portion 1074 of the first supporter 1070.

Hereinbelow, an image sensor according to some example embodiments will be described with reference to FIG. 27. The description will be made with the main focus on the differences from the image sensor illustrated in FIG. 3.

Figure 27:
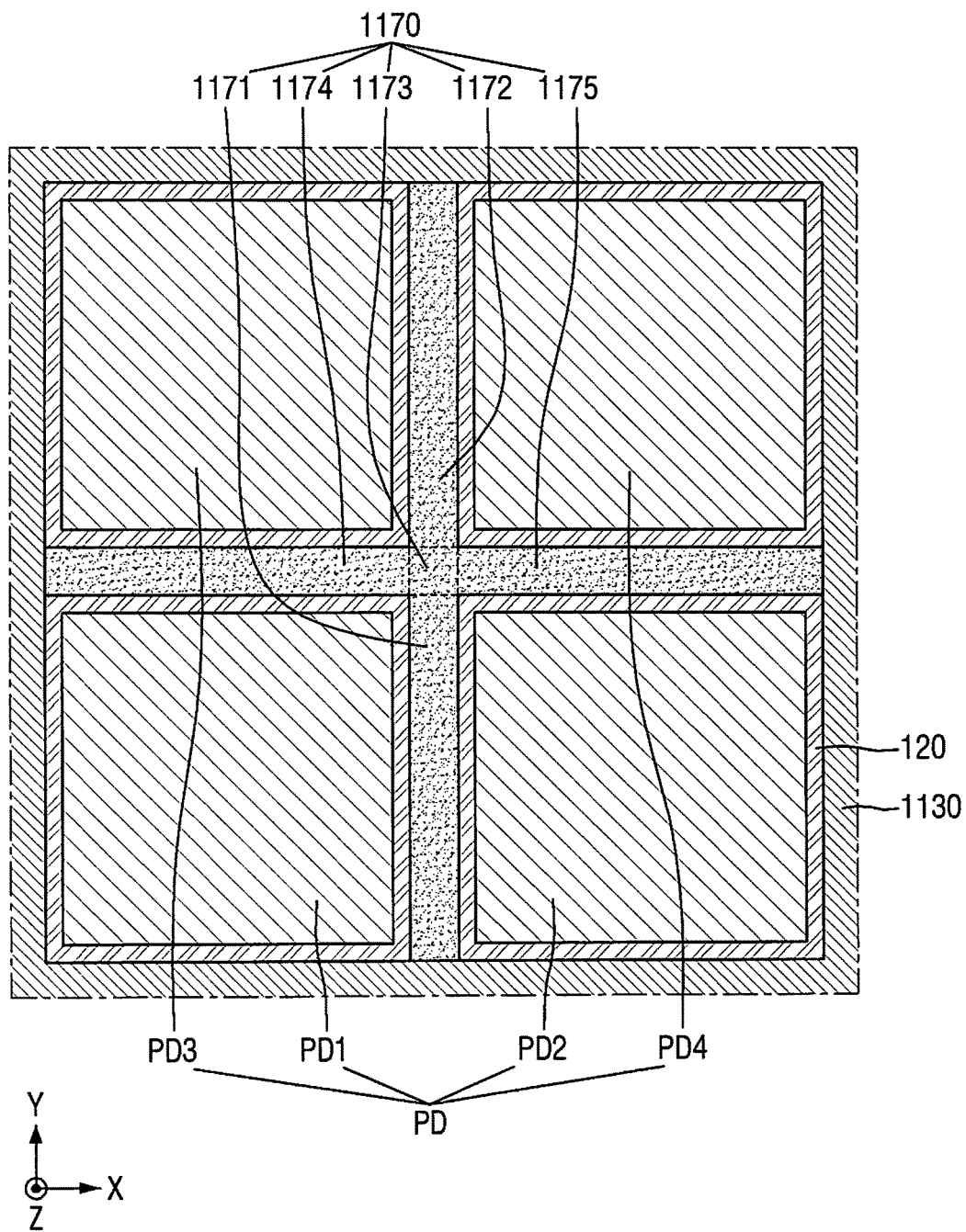
FIG. 27 is a view provided to explain an image sensor according to some example embodiments.

FIG. 27 is a cross-sectional view provided to explain an image sensor according to some example embodiments.

Referring to FIG. 27, in the image sensor according to some example embodiments, the first supporter 1170 may include first to fifth portions 1171, 1172, 1173, 1174, 1175 which are disposed between each of the plurality of photoelectric conversion devices PD.

A first portion 1171 of the first supporter 1170 may be formed to completely overlap the first photoelectric conversion device PD1 in the first direction X. A second portion 1172 of the first supporter 1170 may be formed to completely overlap the fourth photoelectric conversion device PD4 in the first direction X. A fourth portion 1174 of the first supporter 1170 may be formed to completely overlap the first photoelectric conversion device PD1 in the second direction Y. A fifth portion 1175 of the first supporter 1170 may be formed to completely overlap the fourth photoelectric conversion device PD4 in the second direction Y. A third portion 1173 of the first supporter 1170 may be disposed between each of a first portion 1171, a second portion 1172, a fourth portion 1174, and a fifth portion 1175, and connect each of a first portion 1171, a second portion 1172, a fourth portion 1174, and a fifth portion 1175.

Example embodiments according to the present disclosure were explained hereinabove with reference to the drawings attached, but it should be understood that the present disclosure is not limited to the aforementioned example embodiments, but may be fabricated in various different forms, and may be implemented by a person skilled in the art in other specific forms without altering the technical concept or essential characteristics of the present disclosure. Accordingly, it will be understood that the example embodiments described above are only illustrative, and should not be construed as limiting.

What is claimed is:

1. An image sensor, comprising:
a substrate including first and second surfaces opposite each other;
a plurality of photoelectric conversion devices isolated from direct contact with each other within the substrate;
a first trench configured to extend into an interior of the substrate from the first surface of the substrate and between adjacent photoelectric conversion devices of the plurality of photoelectric conversion devices;
a first supporter within the first trench; and
a first isolation layer at least partially covering both sidewalls of the first supporter within the first trench,
wherein a lower surface of the first supporter is coplanar with the first surface of the substrate,
wherein an upper surface of the first supporter is coplanar with an upper surface of the first isolation layer.

2. The image sensor of claim 1, further comprising:
a second trench on the first trench and extending within the substrate from the first surface of the substrate; and
a second isolation layer within the second trench.

3. The image sensor of claim 2, wherein
the second trench extends to the second surface of the substrate.

4. The image sensor of claim 2, further comprising:
a third trench extending within the substrate from the second surface of the substrate between the adjacent photoelectric conversion devices of the plurality of photoelectric conversion devices;
a fourth trench extending from a lower portion of the third trench and from the second surface of the substrate into the interior of the substrate;
a third isolation layer within the third trench; and
a fourth isolation layer within the fourth trench.

5. The image sensor of claim 4, wherein
an upper surface of the second trench is in contact with a lower surface of the fourth trench.

6. The image sensor of claim 5, further comprising:
a second supporter within the third trench.

7. The image sensor of claim 4, wherein
an upper surface of the second trench is isolated from direct contact with a lower surface of the fourth trench.

8. The image sensor of claim 2, wherein
an upper surface of the second trench is within the substrate.

9. The image sensor of claim 2, further comprising:
a sacrificial layer covering an inner wall of the second trench.

10. The image sensor of claim 1, further comprising
a gate on the first surface of the substrate.

11. The image sensor of claim 1, further comprising
a gate on the second surface of the substrate.

12. An image sensor, comprising:
a substrate including first and second surfaces opposite each other;
a plurality of photoelectric conversion devices within the substrate, the plurality of photoelectric conversion devices including
a first photoelectric conversion device,
a second photoelectric conversion device isolated from direct contact with the first photoelectric conversion device in a first direction, a third photoelectric conversion device isolated from direct contact with the first photoelectric conversion device in a second direction orthogonal to the first direction, and a fourth photoelectric conversion device isolated from direct contact with the third photoelectric conversion device in the first direction;

a supporter including a first portion between the first photoelectric conversion device and the second photoelectric conversion device, and a second portion between the third photoelectric conversion device and the fourth photoelectric conversion device; and a first isolation layer at least partially covering both sidewalls of the supporter within the substrate, wherein a lower surface of the supporter is coplanar with the first surface of the substrate, wherein an upper surface of the supporter is coplanar with an upper surface of the first isolation layer.

13. The image sensor of claim 12, wherein the supporter further includes a third portion connecting the first portion of the supporter and the second portion of the supporter.

14. The image sensor of claim 13, wherein the first portion of the supporter completely overlaps the first photoelectric conversion device in the first direction.

15. The image sensor of claim 13, further comprising:

a second isolation layer on the first isolation layer within the substrate, wherein the first portion of the supporter is in a first region adjacent to the third portion of the supporter between the first photoelectric conversion device and the second photoelectric conversion device, and wherein the second portion of the supporter is in a second region adjacent to the third portion of the supporter between the third photoelectric conversion device and the fourth photoelectric conversion device, wherein the second isolation layer is in a first remained region between the first photoelectric conversion device and the second photoelectric conversion device, and a second remained region between the third photoelectric conversion device and the fourth photoelectric conversion device.

16. The image sensor of claim 12, further comprising:

a second isolation layer on the first isolation layer within the substrate wherein the second isolation layer is between the first portion and the second portion.

17. An image sensor, comprising:

a substrate including first and second surfaces opposite each other;

a plurality of photoelectric conversion devices isolated from direct contact with each other within the substrate;

a first isolation layer between adjacent photoelectric conversion devices of the plurality of photoelectric conversion devices, the first isolation layer exposed from the first surface of the substrate;

a second isolation layer on the first isolation layer within the substrate; and a supporter within the first isolation layer and having a lower surface coplanar with the first surface of the substrate, wherein an upper surface of the supporter is coplanar with an upper surface of the first isolation layer.

18. The image sensor of claim 17, further comprising:

a third isolation layer between the adjacent photoelectric conversion devices of the plurality of photoelectric conversion devices, the third isolation layer exposed from the second surface of the substrate; and a fourth isolation layer between the second isolation layer and the third isolation layer.

19. The image sensor of claim 17, further comprising:

a gate on the first surface of the substrate.

* * * * *